US012666772B2

(12) United States Patent
Lee et al.

(10) Patent No.: US 12,666,772 B2
(45) Date of Patent: Jun. 23, 2026

(54) PIXEL AND DISPLAY DEVICE INCLUDING THE SAME

(71) Applicant: Samsung Display Co., LTD., Yongin-si (KR)

(72) Inventors: Jong Chan Lee, Yongin-si (KR); Jun Seok Min, Yongin-si (KR); Jeong Su Park, Yongin-si (KR); Sung Jin Lee, Yongin-si (KR); Woong Hee Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 303 days.

(21) Appl. No.: 18/359,758

(22) Filed: Jul. 26, 2023

(65) Prior Publication Data

US 2024/0038956 A1 Feb. 1, 2024

(30) Foreign Application Priority Data

Jul. 29, 2022 (KR) ........................ 10-2022-0094941

(51) Int. Cl.
*H01L 33/62* (2010.01)
*H01L 25/16* (2023.01)
(Continued)

(52) U.S. Cl.
CPC ........ *H10H 20/857* (2025.01); *H10D 86/441* (2025.01); *H10D 86/60* (2025.01); *H10W 90/00* (2026.01)

(58) Field of Classification Search
CPC .. H10H 20/857; H10H 20/84; H10H 20/8314; H10H 20/831; H10H 20/8512;
(Continued)

(56) References Cited

U.S. PATENT DOCUMENTS 10,090,335 B2 * 10/2018 Kang .................... H01L 25/167
11,552,063 B2 1/2023 Kim et al.
(Continued)

FOREIGN PATENT DOCUMENTS

KR 10-2021-0057891 A 5/2021
KR 10-2022-0026626 A 3/2022
(Continued)

*Primary Examiner* — Nikolay K Yushin
(74) *Attorney, Agent, or Firm* — Womble Bond Dickinson (US) LLP

(57) ABSTRACT

A pixel includes: a first conductive pattern, a second conductive pattern, and a third conductive pattern on a substrate and spaced apart from each other; a passivation layer on and exposing each of the first, second, and third conductive patterns; a via layer on the passivation layer and having first, second, and third via holes respectively exposing one area of the first conductive pattern, one area of the second conductive pattern, and one area of the third conductive pattern; first and second alignment electrodes on the via layer and electrically connected to the second conductive pattern and the first conductive pattern, respectively; and a light emitting element on the first and second alignment electrodes. The via layer has a first area and a second area that is thinner than the first area, and the second area is directly adjacent to at least one of the via holes.

20 Claims, 26 Drawing Sheets

(51) Int. Cl.
| | |
|---|---|
| *H01L 27/12* | (2006.01) |
| *H10D 86/40* | (2025.01) |
| *H10D 86/60* | (2025.01) |
| *H10H 20/857* | (2025.01) |
| *H10W 90/00* | (2026.01) |

(58) Field of Classification Search
CPC .... H10H 29/142; H10H 29/14; H10H 29/845; H10H 29/8515; H10H 29/842; H01L 25/167; H01L 25/16; H01L 25/0753; H01L 25/075; H10D 86/441; H10D 86/40; H10D 86/60; H10D 86/451; H10D 86/481; H10W 90/00
See application file for complete search history.

(56) References Cited

U.S. PATENT DOCUMENTS

| | | | |
|---|---|---|---|
| 12,068,435 B2 | 8/2024 | Shin et al. | |
| 12,294,014 B2* | 5/2025 | Chai | H01L 25/0753 |
| 12,575,243 B2 | 3/2026 | Lee et al. | |
| 2018/0122836 A1* | 5/2018 | Kang | H10H 20/8514 |
| 2021/0399040 A1* | 12/2021 | Chai | H10H 20/831 |
| 2022/0208901 A1 | 6/2022 | Cha | |
| 2022/0384684 A1 | 12/2022 | Lee et al. | |

FOREIGN PATENT DOCUMENTS

| | | |
|---|---|---|
| KR | 10-2022-0043993 A | 4/2022 |
| KR | 10-2022-0094255 A | 7/2022 |
| KR | 10-2022-0159560 A | 12/2022 |

* cited by examiner

PIXEL AND DISPLAY DEVICE INCLUDING THE SAME

CROSS-REFERENCE TO RELATED APPLICATION

This application claims priority to and the benefit of Korean Patent Application No. 10-2022-0094941, filed on Jul. 29, 2022, in the Korean Intellectual Property Office, the entire content of which is incorporated herein by reference.

BACKGROUND

1. Field

Aspects of embodiments of the present disclosure relate to a pixel and a display device including the same.

2. Description of the Related Art

Recently, as interest in an information display is increasing, research and development for display devices are continuously conducted.

SUMMARY

Embodiments of the present disclosure provide a pixel and a display device including the same that may improve reliability.

An embodiment of the present disclosure provides a pixel including: a substrate having an emission area and a non-emission area; a first conductive pattern, a second conductive pattern, and a third conductive pattern on the substrate and spaced apart from each other; a passivation layer on the first, second, and third conductive patterns and exposing each of the first, second, and third conductive patterns; a via layer on the passivation layer and having a first via hole exposing one area of the first conductive pattern, a second via hole exposing one area of the second conductive pattern, and a third via hole exposing one area of the third conductive pattern; a second alignment electrode on the via layer and electrically connected to the first conductive pattern; a first alignment electrode on the via layer and electrically connected to the second conductive pattern; and a light emitting element on the first and second aligned electrodes. The via layer includes a first area having a first thickness and a second area having a second thickness smaller than the first thickness, and the second area is directly adjacent to at least one of the first, second, and third via holes.

The second area of the via layer may extend around at least one side of each of the first and second via holes.

The second area of the via layer may be directly adjacent to at least one side of each of the first and second via holes.

The second area of the via layer may face the first area of the via layer with each of the first and second via holes therebetween, and the second area of the via layer and the first area of the via layer facing each other with the first and second via holes therebetween may have different inclination angles.

From among the second area of the via layer and the first area of the via layer facing each other with the first and second via holes therebetween, an inclination angle of the first area may be greater than an inclination angle of the second area.

The second area may extend around at least one side of each of the first and second via holes in a plan view, and the first area may extend around the second area and the remainder of each of the first and second via holes in the plan view.

The second area of the via layer may extend entirely around each of the first and second via holes.

The second area may have a ring shape extending around each of the first and second via holes in a plan view.

The first area may extend around the second area in a plan view.

Each of the first and second via holes may have a first width, and the second area may have a second width that is smaller than the first width.

The second area may overlap the first, second, and third conductive patterns.

The pixel may further include: a transistor between the substrate and the passivation layer and electrically connected to the light emitting element; a capacitor between the substrate and the passivation layer and including a first storage electrode connected to a gate electrode of the transistor and a second storage electrode electrically connected to the light emitting element; a first power wire configured to receive a voltage of a first driving power source; and a second power wire spaced apart from the first power wire and configured to receive a voltage of a second driving power source different from the first driving power source.

The first conductive pattern may include the second power wire, the second conductive pattern may include the second storage electrode, and the third conductive pattern may include the first power wire.

The pixel may further include: a first insulating layer between the first and second alignment electrodes and the light emitting element; a first bank in the non-emission area and having an opening corresponding to the emission area; a second insulating layer on the light emitting element and exposing a first end portion and a second end portion of the light emitting element; a first electrode electrically connected to the first end portion of the light emitting element; and a second electrode spaced apart from the first electrode and electrically connected to the second end portion of the light emitting element.

The pixel may further include an intermediate electrode spaced apart from the first and second electrodes, The light emitting element may include: a first light emitting element between one side of the first alignment electrode and the second alignment electrode and having a first end portion electrically connected to the first electrode and a second end portion electrically connected to the intermediate electrode; and a second light emitting element between another side of the first alignment electrode and the second alignment electrode and having a first end portion electrically connected to the intermediate electrode and a second end portion electrically connected to the second electrode.

The pixel may further include: a second bank on the first bank in the non-emission area; a color converting layer on the first and second light emitting elements in the emission area and configured to convert light of a first color emitted from the first and second light emitting elements into light of a second color; and a color filter positioned on the color converting layer and configured to selectively transmit the light of the second color.

Another embodiment of the present disclosure provides a display device including: a substrate having a display area and a non-display area, the non-display area including a pad area; a plurality of pixels in the display area and having an emission area and a non-emission area, respectively; and a pad in the pad area and electrically connected to each of the pixels. Each of the plurality of pixels includes: a first conductive pattern, a second conductive pattern, and a third conductive pattern spaced apart from each other on the substrate; a passivation layer on the first, second, and third conductive patterns and exposing each of the first, second, and third conductive patterns; a via layer on the passivation layer and having a first via hole exposing one area of the first conductive pattern, a second via hole exposing one area of the second conductive pattern, and a third via hole exposing one area of the third conductive pattern; a first alignment electrode and a second alignment electrode on the via layer and spaced apart from each other; an insulating layer on the first and second alignment electrodes; a light emitting element on the insulating layer between the first alignment electrode and the second alignment electrode; and a first electrode and a second electrode electrically connected to the light emitting element and spaced apart from each other. The via layer has a first area having a first thickness and a second area having a second thickness that is thinner than the first thickness, the second area is directly adjacent to at least one of the first, second, and third via holes, and the via layer is not in the pad area.

The second area of the via layer may extend around at least one side of each of the first and second via holes.

The second area of the via layer may extend entirely around each of the first, second, and third via holes.

The pad may include: a first pad electrode on the substrate; the passivation layer on the first pad electrode and including a first pad electrode contact hole exposing a portion of the first pad electrode; the insulating layer on the passivation layer and including a second pad electrode contact hole corresponding to the first pad electrode contact hole; and a second pad electrode on the insulating layer and electrically connected to the first pad electrode through the first and second pad electrode contact holes.

According to embodiments of the present disclosure, a via layer positioned near via holes has a smooth profile so that a conductive pattern (or an alignment electrode) positioned in the via holes is not cut, thereby improving reliability.

Aspects and features of the present disclosure are not limited by those described above, and more various aspects and features are described in the present specification and/or may be understood by one of ordinary skill in the art to which the present disclosure pertains.

BRIEF DESCRIPTION OF THE DRAWINGS

FIG. 7 to FIG. 11 illustrate schematic cross-sectional views taken along the line II-II' of FIG. 6.

FIG. 12 illustrates a schematic cross-sectional view taken along the line III-III' of FIG. 6.

4

Figure 13A:
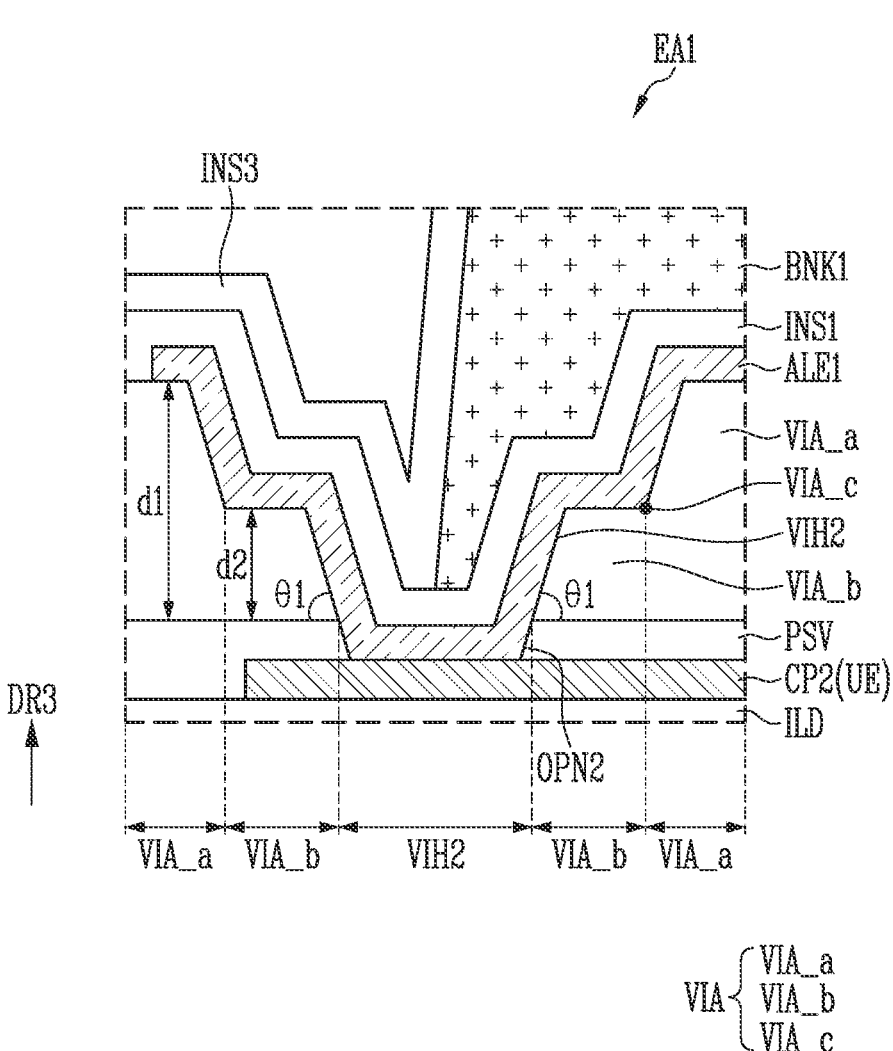
FIG. 13A illustrates a schematic enlarged view of the portion EA1 of FIG. 12.
Figure 13B:
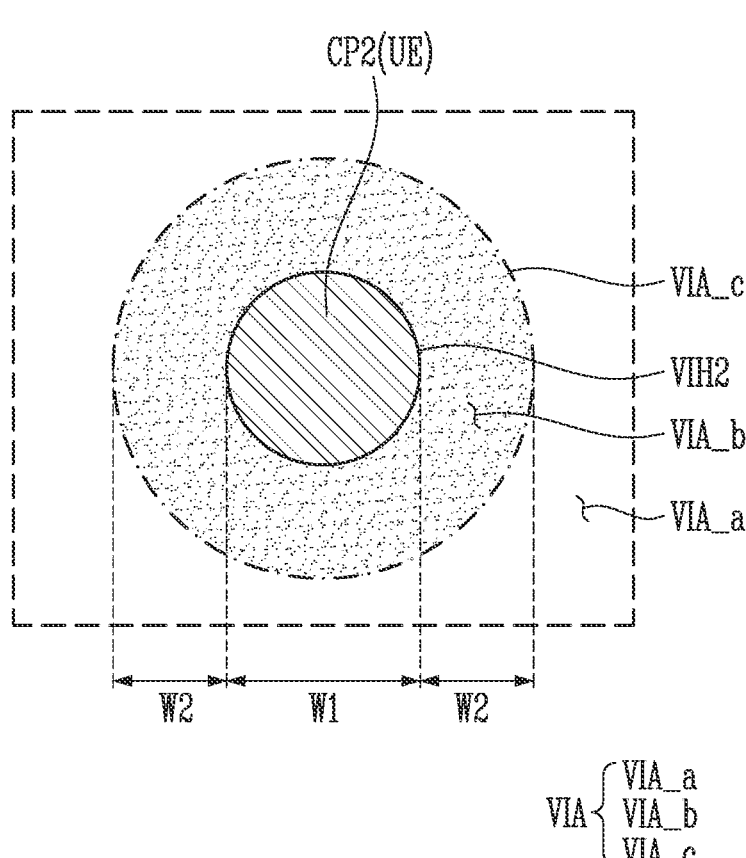

FIG. 13B illustrates a schematic drawing of a second conductive pattern and a via layer shown in FIG. 13A viewed from above.

Figure 12:
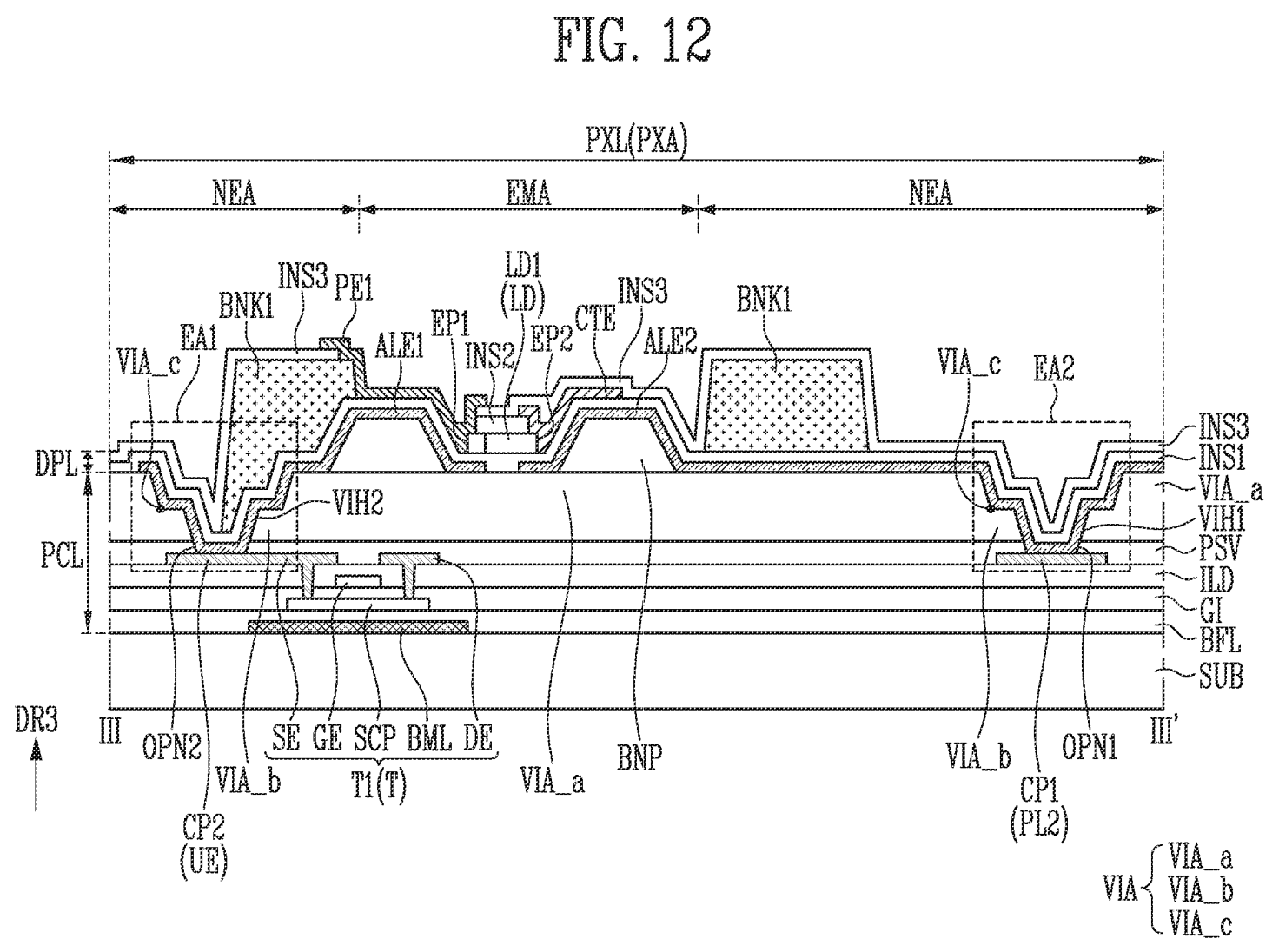
Figure 14A:
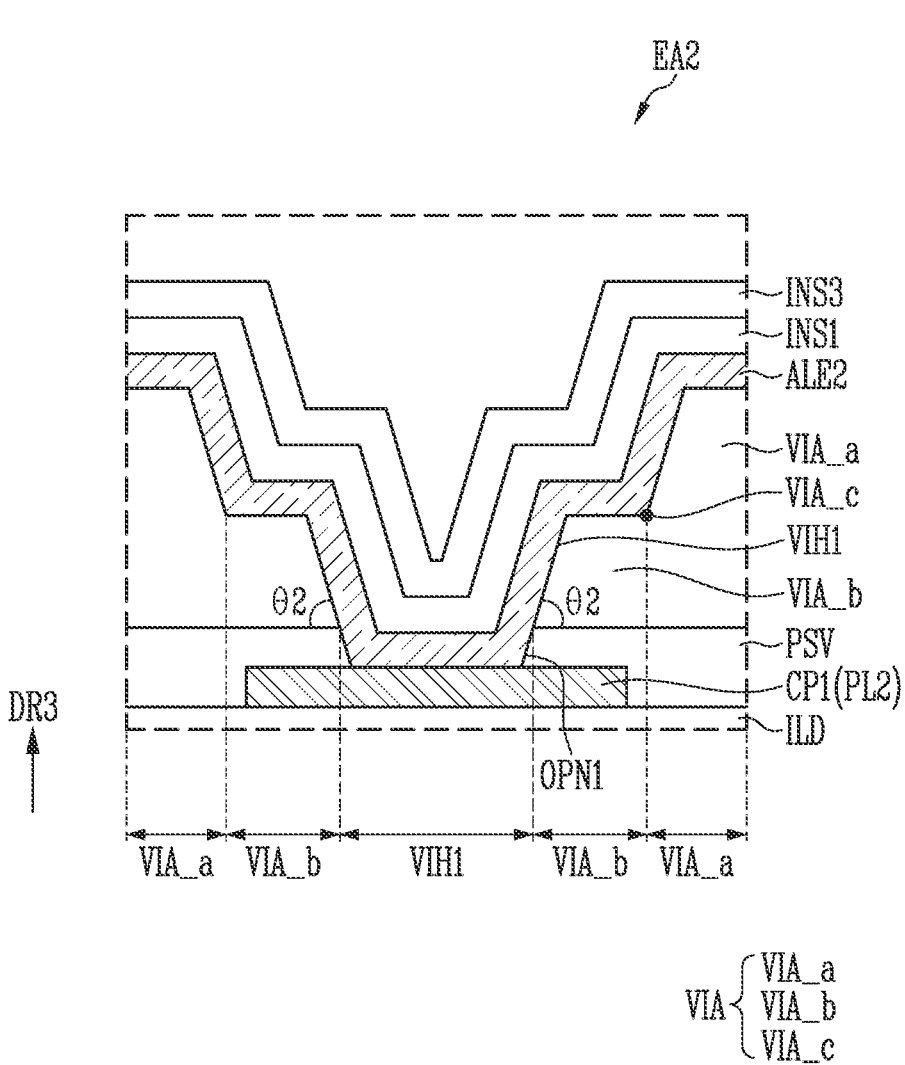
Figure 14B:
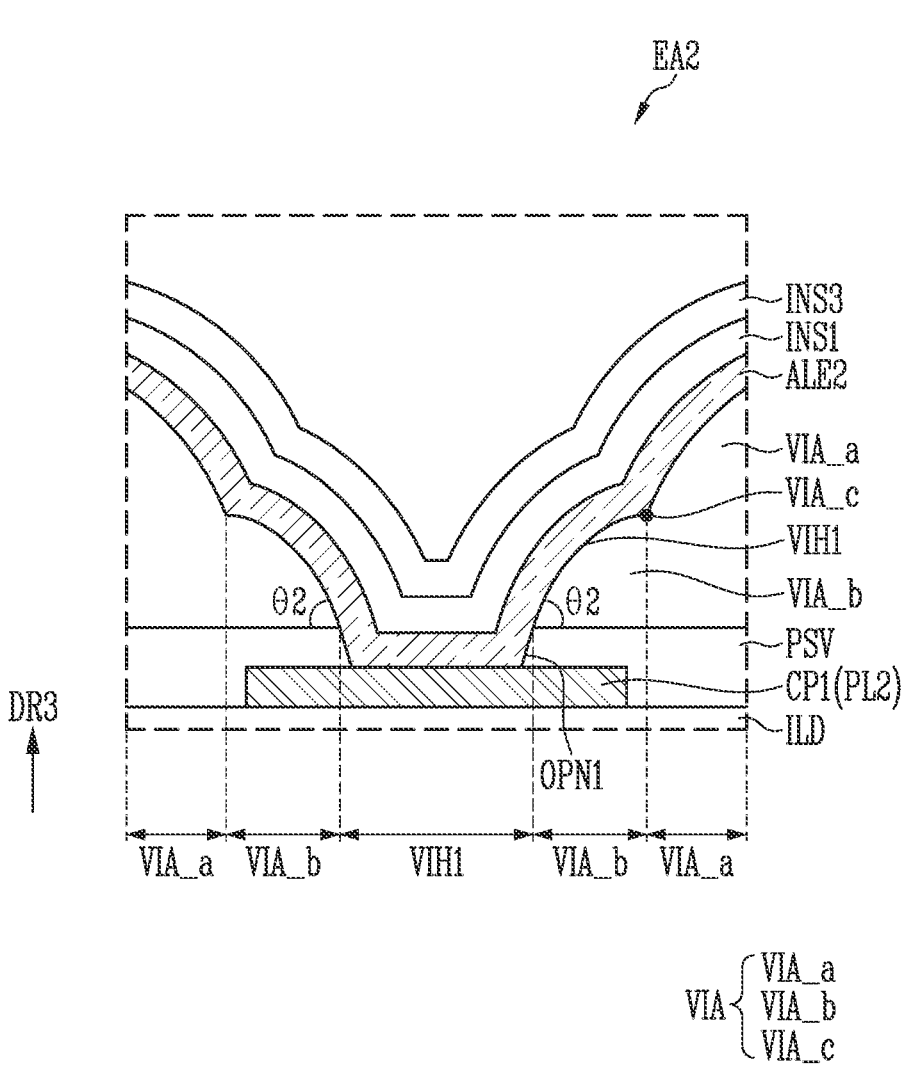

FIG. 14A and FIG. 14B illustrate schematic enlarged views of the portion EA2 of FIG. 12.

Figure 14C:
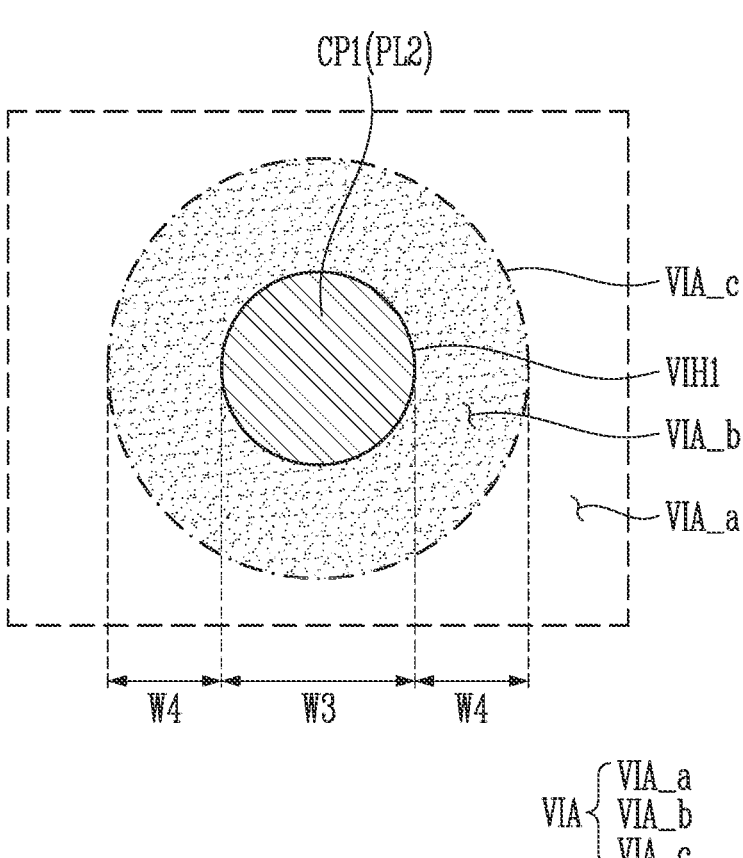

FIG. 14C illustrates a schematic drawing of a first conductive pattern and a via layer shown in FIG. 14A viewed from above.

Figure 6:
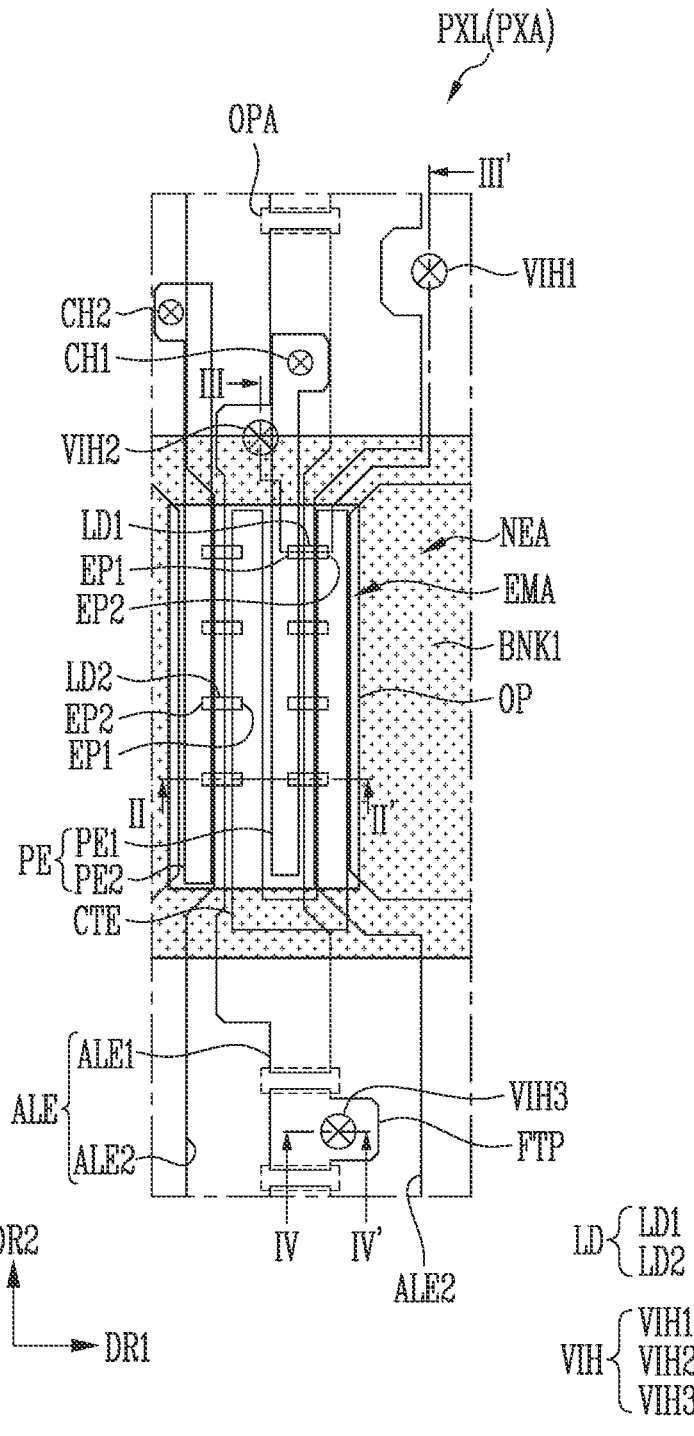
FIG. 6 illustrates a schematic top plan view of a pixel illustrated in FIG. 3.
Figure 15:
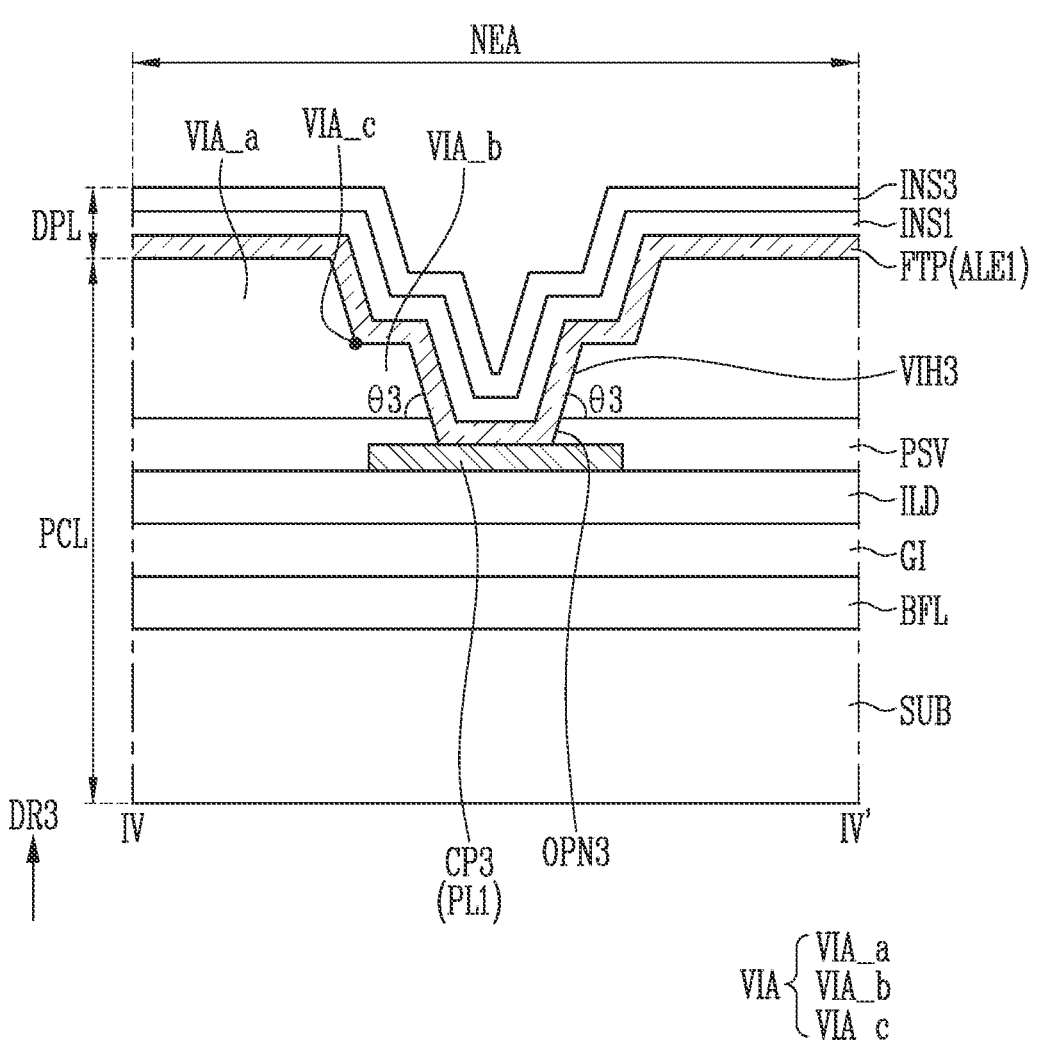

FIG. 15 illustrates a schematic cross-sectional view taken along the line IV-IV' of FIG. 6.

Figure 16A:
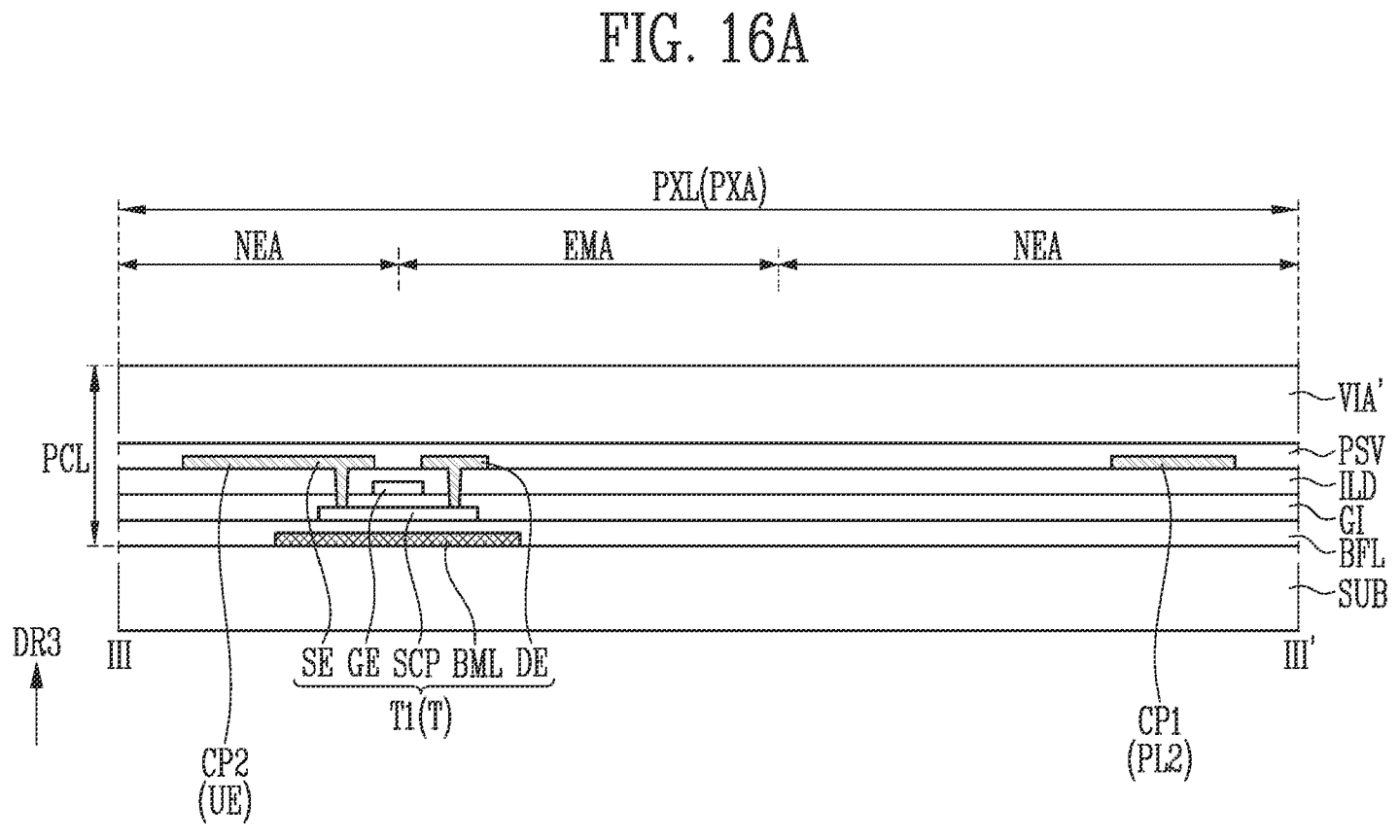
Figure 16B:
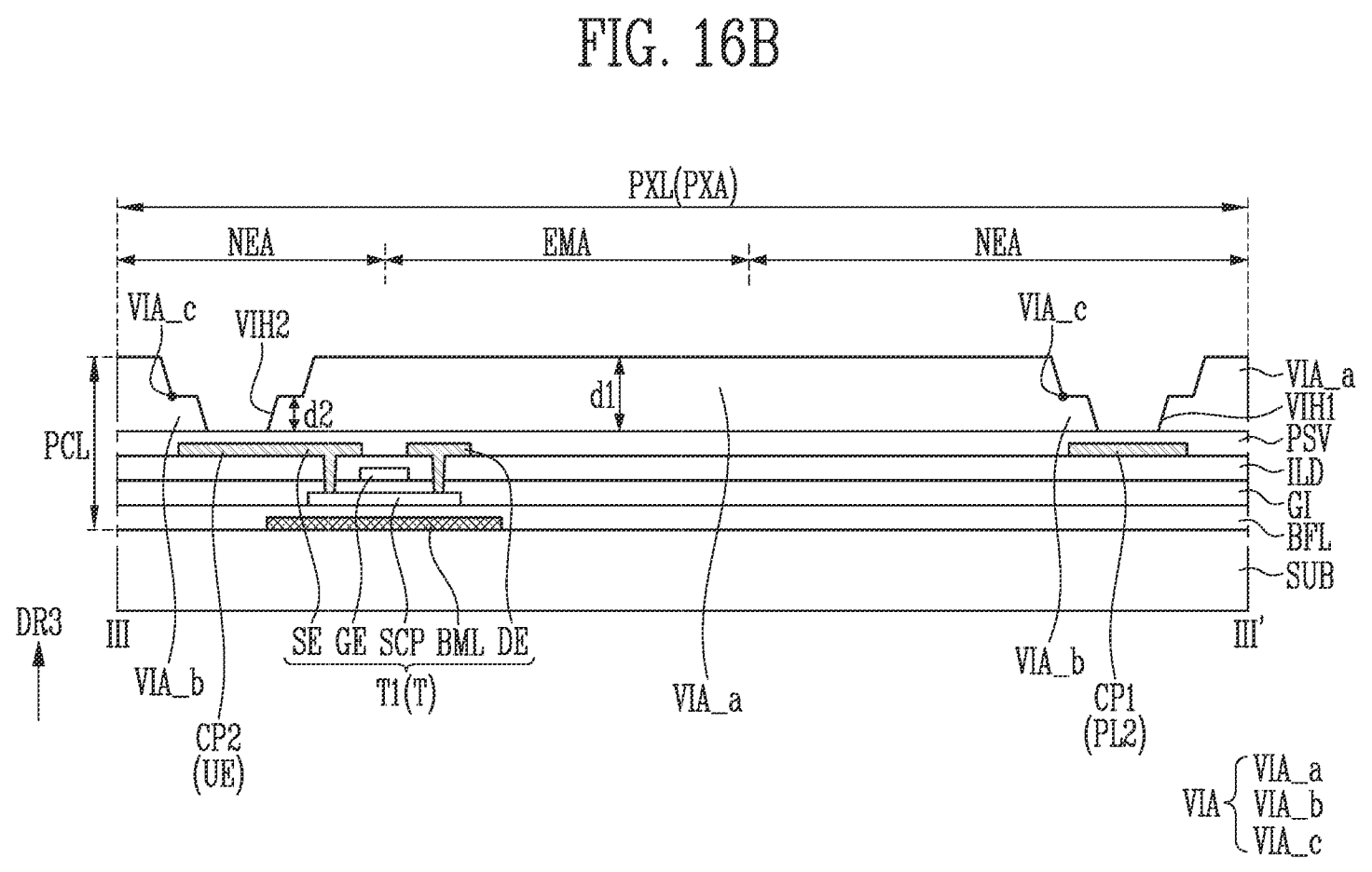
Figure 16C:
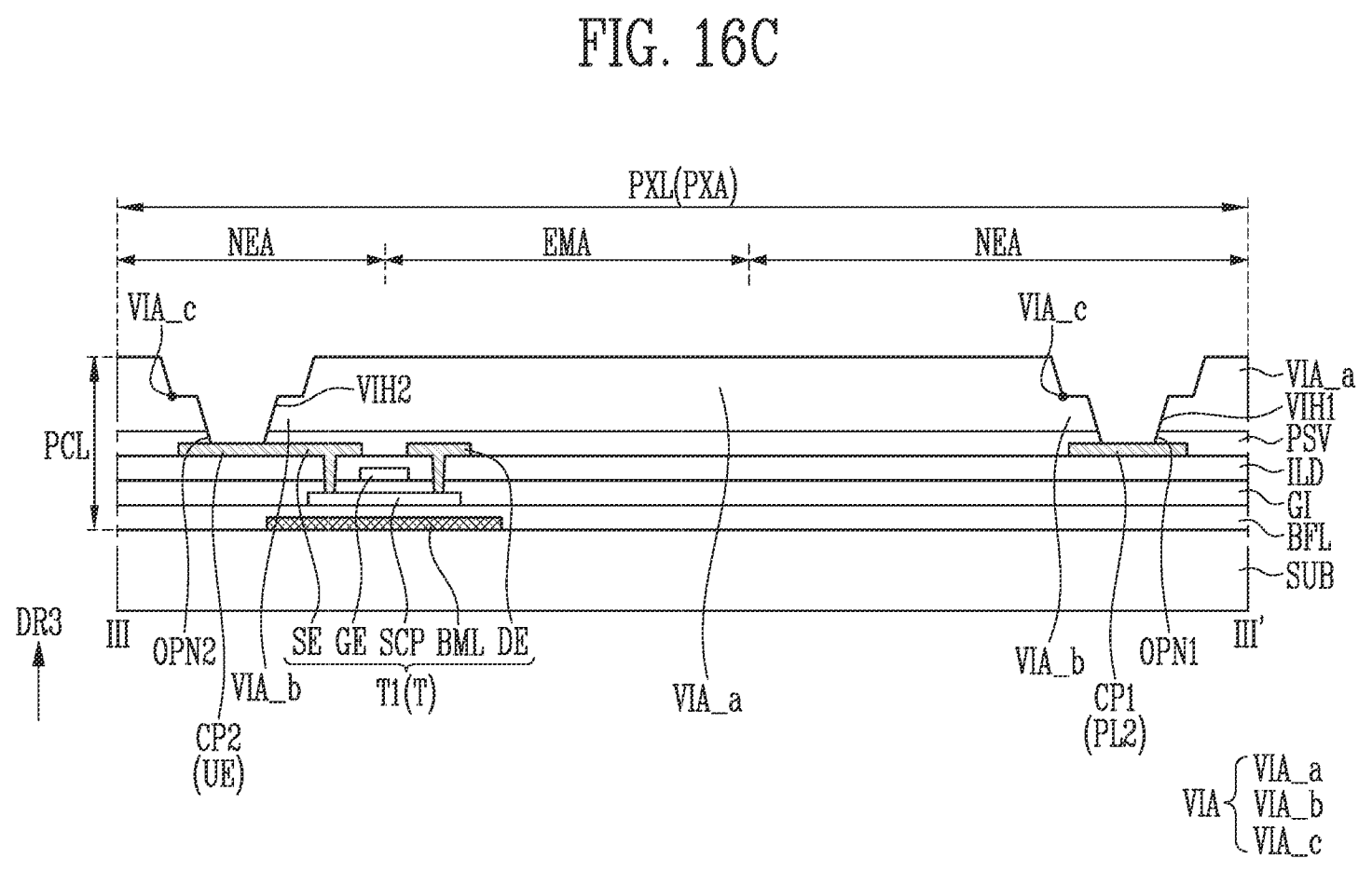

FIG. 16A to FIG. 16C illustrate schematic cross-sectional views of steps of a manufacturing method of a via layer and a passivation layer shown in FIG. 12.

Figure 3:
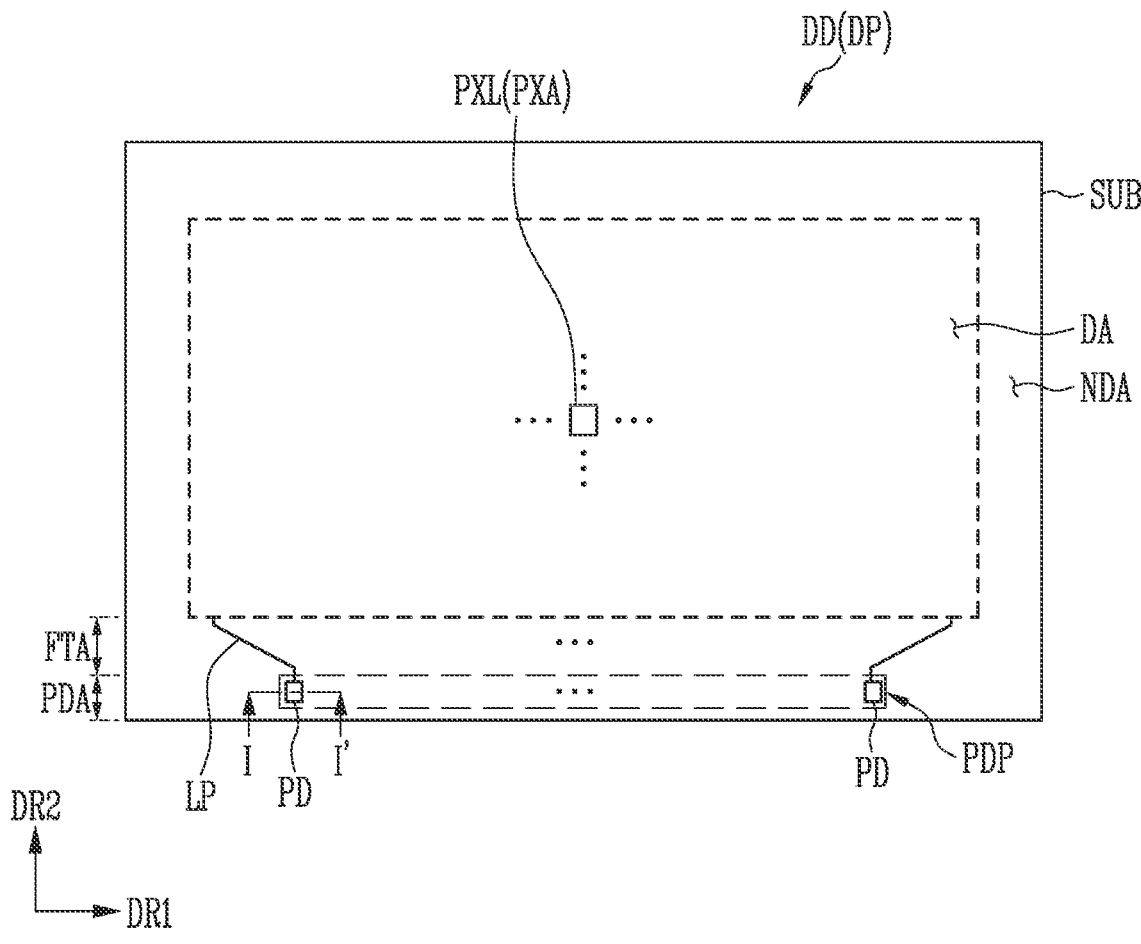
FIG. 3 illustrates a schematic top plan view of a display device according to an embodiment.
Figure 17:
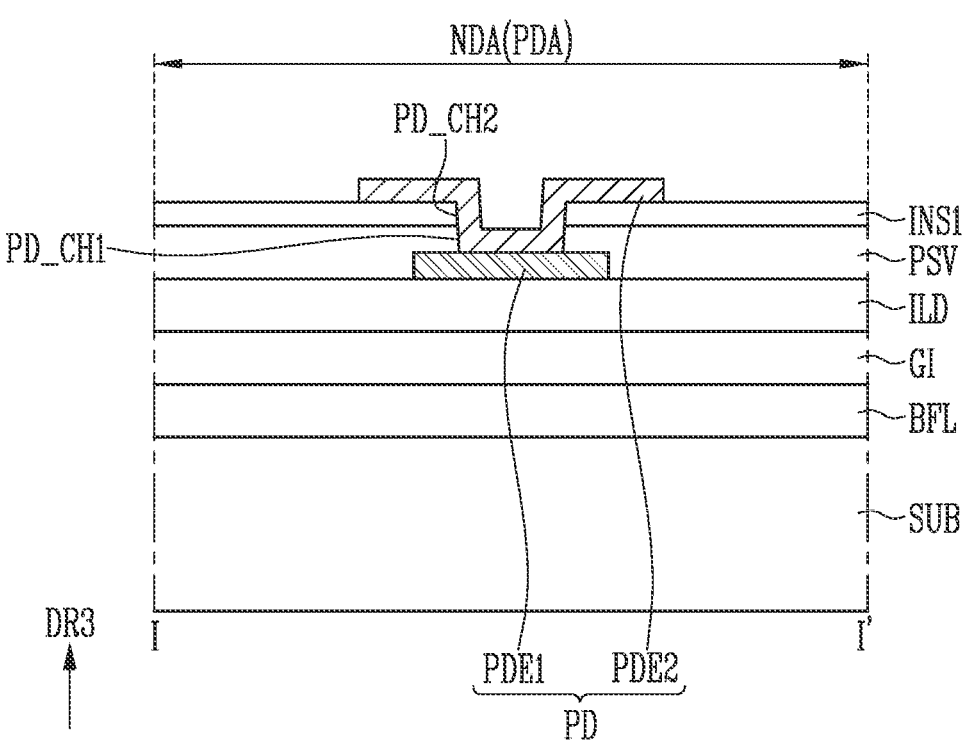

FIG. 17 illustrates a schematic cross-sectional view taken along the line I-I' of FIG. 3.

Figure 18:
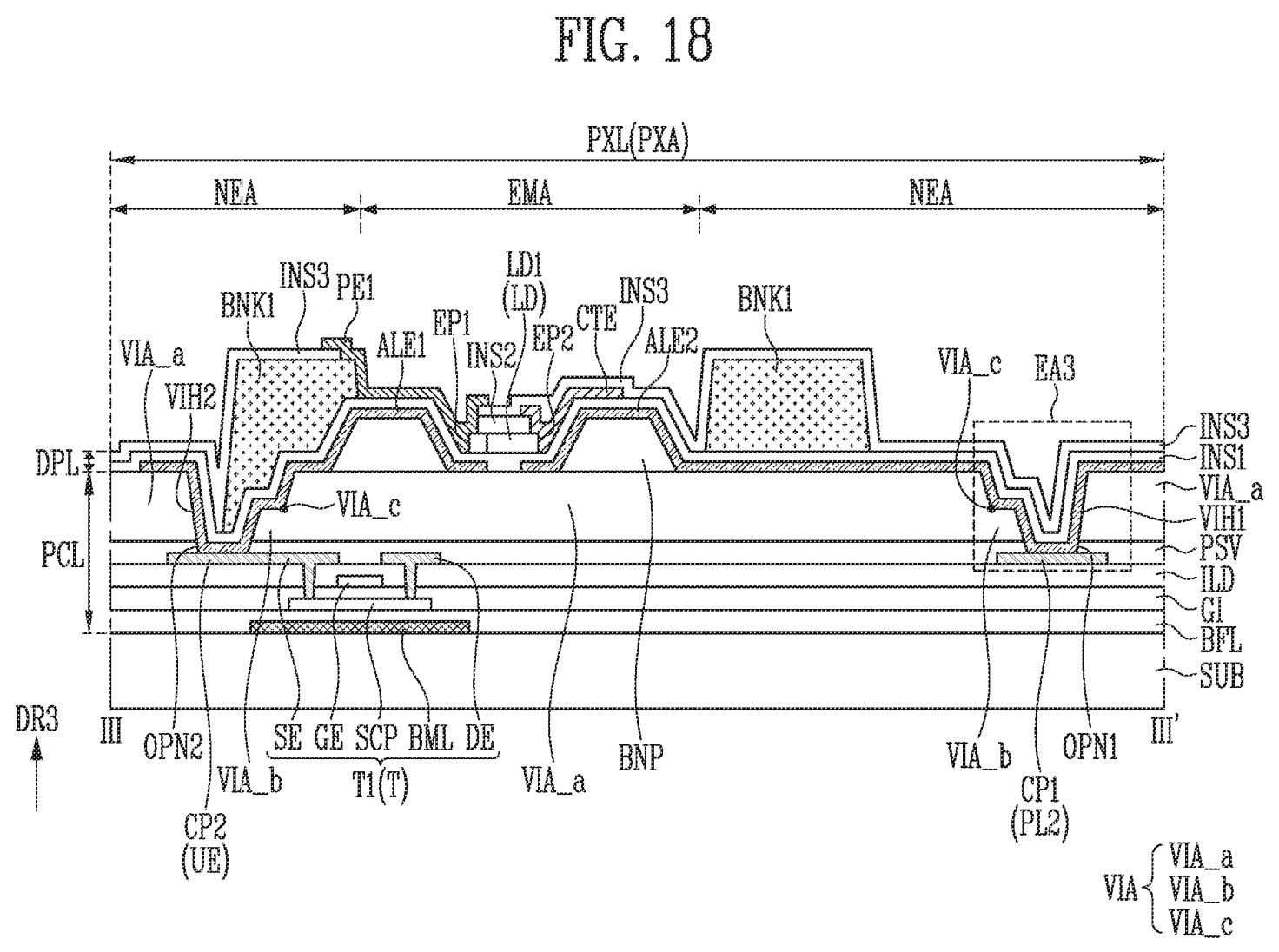

FIG. 18 illustrates a schematic cross-sectional view taken along the line III-III' of FIG. 6 according to an embodiment.

Figure 19A:
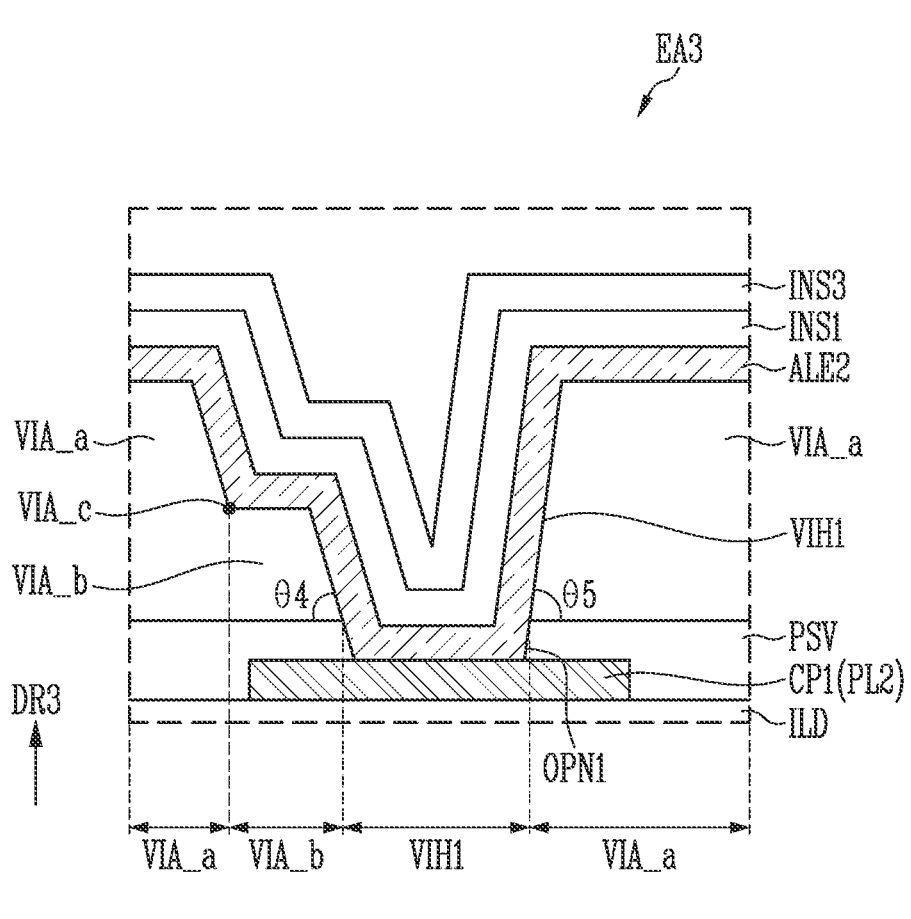

FIG. 19A illustrates a schematic enlarged view of the area EA3 of FIG. 18.

Figure 19B:
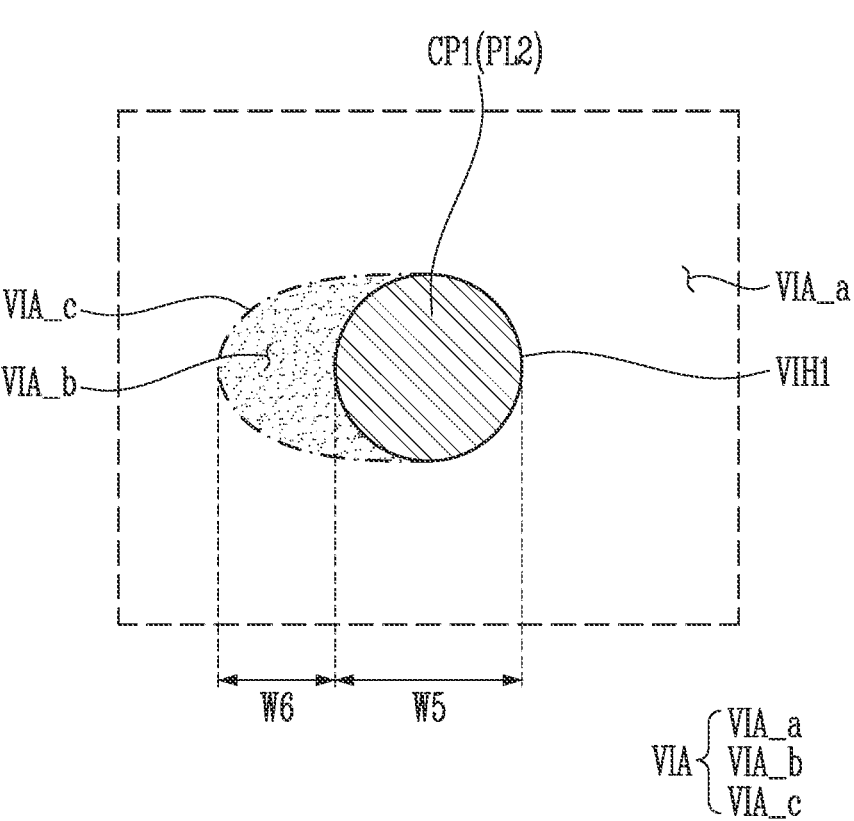
Figure 19C:
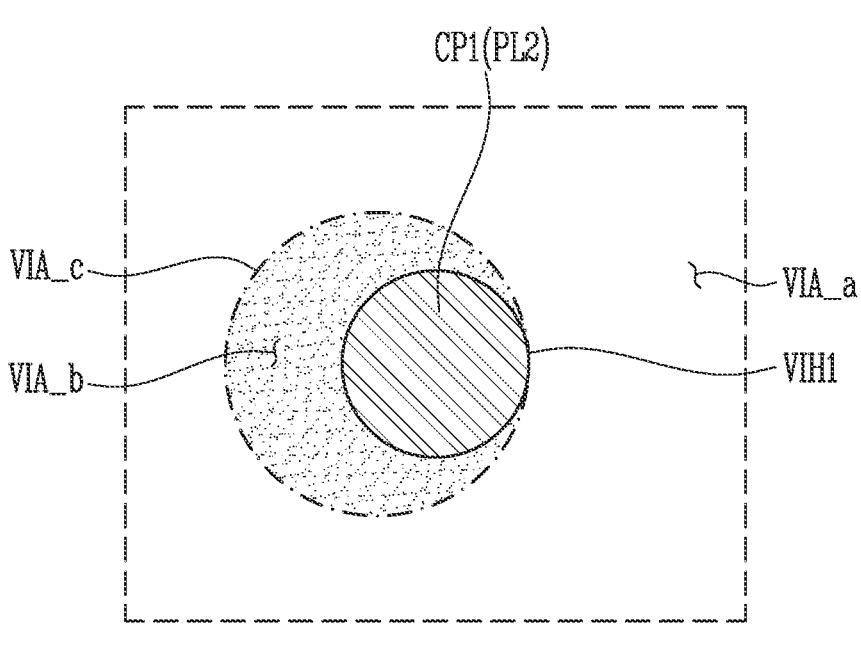

FIG. 19B and FIG. 19C illustrate schematic drawings of a first conductive pattern and a via layer shown in FIG. 19A viewed from above.

DETAILED DESCRIPTION

Because the present disclosure may be variously modified and have various forms, embodiments will be illustrated and described in detail in the following. This, however, by no means restricts the present disclosure to the described embodiments, and it is to be understood as embracing all changes, equivalents, and substitutes included in the technical scope of the present disclosure.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, with reference to accompanying drawings, embodiments of the present disclosure for those skilled in the art to understand the contents of the present disclosure will be described in more detail.

Figure 1:
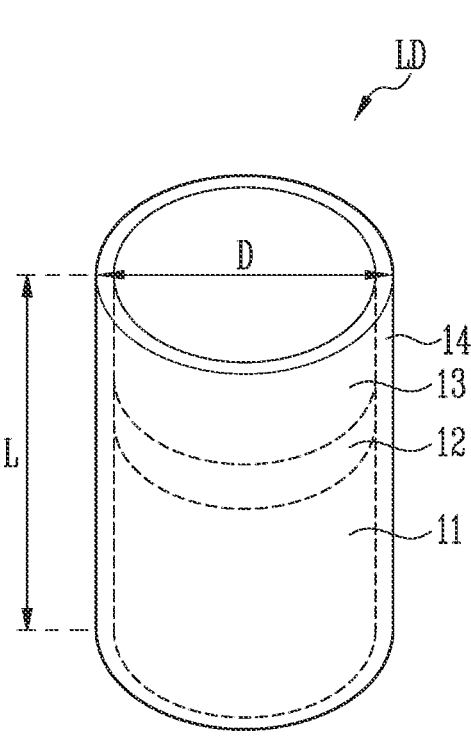
FIG. 1 illustrates a schematic perspective view of a light emitting element according to an embodiment.
Figure 2:
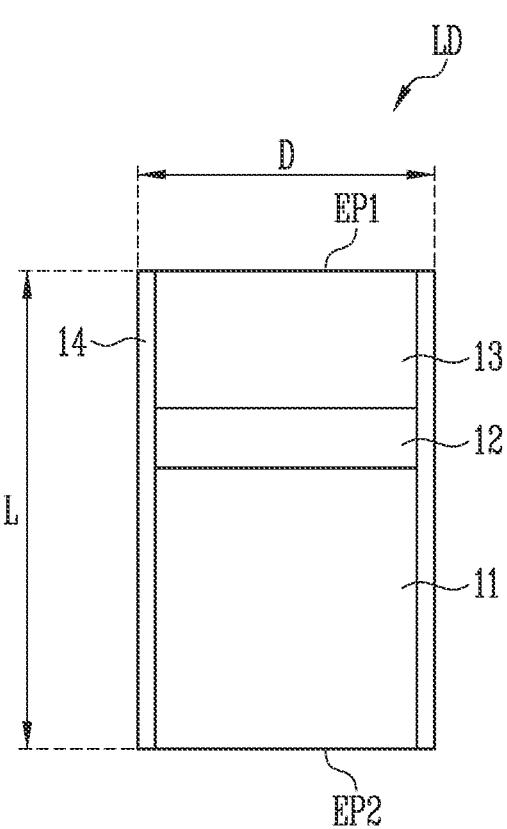
FIG. 2 illustrates a schematic cross-sectional view of the light emitting element shown in FIG. 1.

FIG. 1 illustrates a schematic perspective view of a light emitting element LD according to an embodiment, and FIG. 2 illustrates a schematic cross-sectional view of the light emitting element shown in FIG. 1.

Referring to FIG. 1 and FIG. 2, the light emitting element LD may include a first semiconductor layer 11, a second semiconductor layer 13, and an active layer 12 interposed between the first and second semiconductor layers 11 and 13. For example, the light emitting element LD may be implemented as a stacked light emitting body (or a stacked pattern) in which the first semiconductor layer 11, the active layer 12, and the second semiconductor layer 13 are sequentially stacked. However, a type and/or shape of the light emitting element LD are not limited to the embodiment shown in FIG. 1.

The light emitting element LD may have a shape extending in (e.g., primarily extending in) one direction. When an extending direction of the light emitting element LD is a length direction, the light emitting element LD may have a first end portion (e.g., a first end) EP1 and a second end portion (e.g., a second end) EP2 facing each other (e.g., opposite to each other) along the length direction. One of the first semiconductor layer 11 and the second semiconductor layer 13 may be positioned on the first end portion EP1 of the light emitting element LD, and the other of the first semiconductor layer 11 and the second semiconductor layer 13 may be positioned on the second end portion EP2 of the light emitting element LD. For example, the second semiconductor layer 13 may be positioned on the first end portion EP1 of the light emitting element LD, and the first semiconductor layer 11 may be positioned on the second end portion EP2 of the corresponding light emitting element LD.

The light emitting element LD may have various shapes. As an example, the light emitting element LD may have a rod-like shape, bar-like shape, or pillar shape that is long (e.g., having an aspect ratio greater than 1) in a length direction as shown in FIG. 1. As another example, the light emitting element LD may have a rod-like shape, bar-like shape, or pillar shape that is short (e.g., having an aspect ratio less than 1) in a length direction. As another example, the light emitting element LD may have a rod-like shape, bar-like shape, or pillar shape that has an aspect ratio of 1.

For example, the light emitting element LD may include a light emitting diode (LED) manufactured in an ultra-small size having a diameter D and/or a length L of nano scale (or nano meter) to micro scale (or micrometer).

When the light emitting element LD is long in a length direction (e.g., has an aspect ratio greater than 1), the diameter D of the light emitting element LD may be in a range of about 0.5 $\mu$m to about 6 $\mu$m, and the length L thereof may be in a range of about 1 $\mu$m to about 10 $\mu$m. However, the diameter D and the length L of the light emitting element LD are not limited thereto, and the size of the light emitting element LD may be changed so that the light emitting element LD meets requirements (or design conditions) of a lighting device or a self-luminous display device to which the light emitting element LD is to be applied.

For example, the first semiconductor layer 11 may include at least one n-type semiconductor layer. For example, the first semiconductor layer 11 may include a semiconductor material of one of InAlGaN, GaN, AlGaN, InGaN, AlN, and InN and may be a n-type semiconductor layer doped with a first conductive dopant (e.g., an n-type dopant), such as Si, Ge, Sn, or the like. However, the material included in the first semiconductor layer 11 is not limited thereto, and the first semiconductor layer 11 may be made of various suitable materials.

The active layer 12 is disposed on the first semiconductor layer 11 and may be formed to have a single or multi-quantum well structure. For example, when the active layer 12 is formed to have a multi-quantum well structure, the active layer 12 may have a structure in which a barrier layer, a strain reinforcing layer, and a well layer, which form one unit, are periodically and repeatedly stacked. However, the structure of the active layer 12 is not limited to the above-described embodiment.

The active layer 12 may emit light having a wavelength in a range of about 400 nm to about 900 nm and may have a double hetero-structure. In an embodiment, a clad layer doped with a conductive dopant may be formed above and/or below the active layer 12 along the length direction of the light emitting element LD. For example, the clad layer may be formed as an AlGaN layer or an InAlGaN layer. In some embodiments, a material, such as AlGaN and InAlGaN, may be used to form the active layer 12, and in addition, various suitable materials may form the active layer 12. The active layer 12 may have a first surface contacting the first semiconductor layer 11 and a second surface contacting the second semiconductor layer 13.

When an electric field formed by a reference voltage (e.g., a predetermined voltage) or more is applied to respective end portions of the light emitting element LD, the light emitting element LD emits light as electron-hole pairs are combined in the active layer 12. By controlling the light emission of the light emitting element LD according to this principle, the light emitting element LD may be used as a light source (or light emitting source) for various light emitting devices in addition to pixels of a display device.

The second semiconductor layer 13 is disposed on the second surface of the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material of one of InAlGaN, GaN, AlGaN, InGaN, AlN, and InN and may include a p-type semiconductor layer doped with a second conductive dopant (e.g., a p-type dopant), such as Mg, Zn, Ca, Sr, and Ba. However, the material included in the second semiconductor layer 13 is not limited thereto, and the second semiconductor layer 13 may be formed of various suitable materials.

In an embodiment, the first semiconductor layer 11 and the second semiconductor layer 13 may have different thicknesses from each other in the length direction of the light emitting element LD. For example, the first semiconductor layer 11 may have a relatively thicker thickness than that of the second semiconductor layer 13 along the length direction of the light emitting element LD.

In FIGS. 1 and 2, each of the first semiconductor layer 11 and the second semiconductor layer 13 is illustrated as being formed as one layer, but the present disclosure is not limited thereto. In some embodiments, each of the first semiconductor layer 11 and the second semiconductor layer 13 may include at least one or more layers, for example, a cladding layer and/or a tensile strain barrier reducing (TSBR) layer according to the material of the active layer 12. The TSBR layer may be a strain reducing layer disposed between semiconductor layers having different lattice structures to act as a buffer to reduce a difference in lattice constant. The TSBR layer may be formed of a p-type semiconductor layer, such as p-GaInP, p-AlInP, or p-AlGaInP, but is not limited thereto.

In some embodiments, the light emitting element LD may further include a contact electrode (hereinafter referred to as a "first contact electrode") disposed on the second semiconductor layer 13 in addition to the first semiconductor layer 11, the active layer 12, and the second semiconductor layer 13 described above. In another embodiment, another contact electrode (hereinafter referred to as a "second contact electrode") disposed on one end of the first semiconductor layer 11 may be further included.

Each of the first and second contact electrode electrodes may be an ohmic contact electrode but are not limited thereto. In some embodiments, the first and second contact electrodes may be a Schottky contact electrode. The first and second contact electrodes may include a conductive material. For example, the first and second contact electrodes may include an opaque metal in which chromium (Cr), titanium (Ti), aluminum (Al), gold (Au), nickel (Ni), and an oxide or alloy thereof are used alone or in combination, but they are not limited thereto. In some embodiments, the first and second contact electrodes may include a transparent conductive oxide, such as an indium tin oxide (ITO), an indium zinc oxide (IZO), a zinc oxide (ZnOx), an indium gallium zinc oxide (IGZO), and an indium tin zinc oxide (ITZO). The zinc oxide ($ZnO_x$) may be a zinc oxide (ZnO) and/or a zinc peroxide ($ZnO_2$).

Materials included in the first and second contact electrodes may be the same or different from each other. The first and second contact electrodes may be substantially transparent or translucent. Accordingly, light generated by the light emitting element LD may transmit through each of the first and the second contact electrodes to be outputted to the outside of the light emitting element LD. In some embodiments, when the light generated by the light emitting element LD does not transmit through the first and second contact electrodes but is emitted to the outside through an area other than respective end portions (for example, the first and second end portions EP1 and EP2) of the light emitting element LD, the first and second contact electrodes may include an opaque metal.

In an embodiment, the light emitting element LD may further include an insulating film 14. However, in some embodiments, the insulating film 14 may be omitted or may be provided to cover only some of (e.g., portions of) the first semiconductor layer 11, the active layer 12, and the second semiconductor layer 13.

The insulating film 14 may prevent an electrical short circuit that may occur when the active layer 12 contacts conductive materials other than the first and second semiconductor layers 11 and 13. In addition, the insulating film 14 may reduce or minimize surface defects of the light emitting element LD to improve lifespan and luminous efficiency of the light emitting element LD. In addition, when a plurality of light emitting elements LD are closely disposed, the insulating film 14 may prevent unwanted short circuits that may occur between the light emitting elements LD. As long as the active layer 12 may not short circuit with an external conductive material, the insulating film 14 may be omitted.

The insulating film 14 may be provided to entirely surround an outer circumferential surface of a light emitting stacked structure including the first semiconductor layer 11, the active layer 12, and the second semiconductor layer 13.

The structure in which the insulating film 14 entirely surrounds the outer circumferential surfaces of the first semiconductor layer 11, the active layer 12, and the second semiconductor layer 13 is described and illustrated in FIGS. 1 and 2, but the present disclosure is not limited thereto. In some embodiments, when the light emitting element LD includes the first contact electrode, the insulating film 14 may entirely surround the outer circumferential surface of each of the first semiconductor layer 11, the active layer 12, the second semiconductor layer 13, and the first contact electrode. In addition, according to another embodiment, the insulating film 14 may not entirely surround the outer circumferential surface of the first contact electrode or may surround only a portion of the outer circumferential surface of the first contact electrode and may not surround the remaining portion of the external circumferential surface of the first contact electrode. In addition, in some embodiments, when the first contact electrode is disposed at the first end portion EP1 of the light emitting element LD and the second contact electrode is disposed at the second end portion EP2 of the light emitting element LD, the insulating film 14 may expose at least one area of each of the first and second contact electrodes.

The insulating film 14 may include a transparent insulating material. For example, the insulating film 14 may include one or more of a silicon oxide ($SiO_x$), a silicon nitride ($SiN_x$), a silicon oxynitride ($SiO_xN_y$), an aluminum oxide ($AlO_x$), a titanium oxide ($TiO_x$), a hafnium oxide ($HfO_x$), a titanium strontium oxide ($SrTiO_x$), a cobalt oxide ($Co_xO_y$), a magnesium oxide (MgO), zinc oxide (ZnO), a ruthenium oxide ($RuO_x$), a nickel oxide (NiO), a tungsten oxide ($WO_x$), a tantalum oxide ($TaO_x$), a gadolinium oxide ($GdO_x$), a zirconium oxide ($ZrO_x$), a gallium oxide ($GaO_x$), a vanadium oxide ($V_xO_y$), a ZnO:Al, a ZnO:B, a $In_xO_y$:H, a niobium oxide ($Nb_xO_y$), a magnesium fluoride (MgFx), a fluorinated aluminum ($AlF_x$), an alucone polymer film, a titanium nitride (TiN), a tantalum nitride (TaN), an aluminum nitride (AlNx), a gallium nitride (GaN), a tungsten nitride (WN), a hafnium nitride (HfN), a niobium nitride (NbN), a gadolinium nitride (GdN), a zirconium nitride (ZrN), and a vanadium nitride (VN), but the present disclosure is not limited thereto, and various suitable materials having insulating properties may be used as the material of the insulating film 14.

The insulating film 14 may be provided as a single film or may be provided as a multifilm including a double film. For example, when the insulating film 14 is configured as a double layer including a first layer and a second layer that are sequentially stacked, the first layer and the second layer may be made of different materials (or substances) and may be formed by different processes. In some embodiments, the first layer and the second layer may include the same material and may be formed by a continuous process.

In some embodiments, the light emitting element LD may be implemented in a light emitting pattern having a core-shell structure. In such an embodiment, the above-described first semiconductor layer 11 may be positioned at a core, that is, a middle (or center) of the light emitting element LD, and the active layer 12 may surround the outer circumferential surface of the first semiconductor layer 11, and the second semiconductor layer 13 may be provided and/or formed to surround the active layer 12. In addition, the light emitting element LD may further include a contact electrode surrounding at least one side of the second semiconductor layer 13. In addition, in some embodiments, the light emitting element LD may further include the insulating film 14 provided on the outer circumferential surface of the light emitting pattern having a core-shell structure and including a transparent insulating material. The light emitting element LD implemented in the light emitting pattern having the core-shell structure may be manufactured by a growth method.

The above-described light emitting element LD may be used as a light emitting source (or light source) for various display devices. The light emitting element LD may be manufactured through a surface treatment process. For example, when the plurality of light emitting elements LD are mixed with a fluid solution (e.g., a solvent) and supplied to each pixel area (e.g., an emission area of each pixel or an emission area of each sub pixel), each light emitting element LD may be surface-treated so that the light emitting elements LD may not be non-uniformly aggregated in the solution and may be uniformly sprayed.

An emission component (e.g., an emission device or emission unit) including the above-described light emitting element LD may be used in various types of electronic devices including a display device and a light source. For example, when a plurality of light emitting elements LD are disposed in a pixel area of each pixel of a display panel, the light emitting elements LD may be used as a light source of each pixel. However, an application field of the light emitting element LD is not limited to the above-described example. For example, the light emitting element LD may be used in other types of electronic devices that include (or use) a light source, such as a lighting device.

Figure 4:
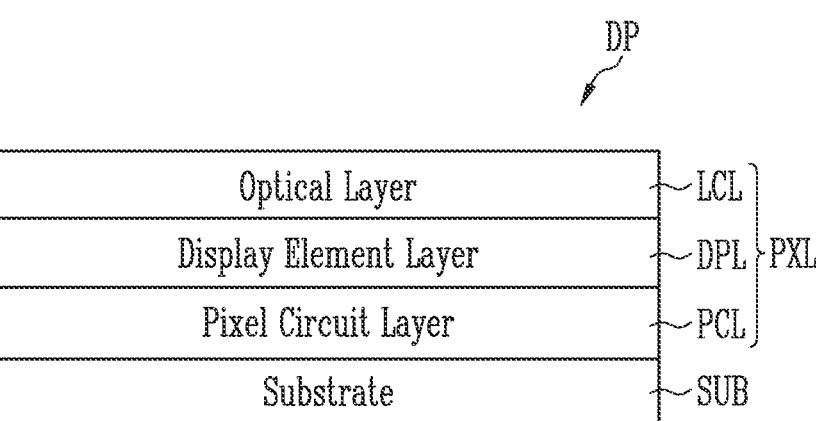
FIG. 4 illustrates a schematic cross-sectional view of a display panel illustrated in FIG. 3.

FIG. 3 illustrates a schematic top plan view of a display device DD according to an embodiment, and FIG. 4 illustrates a schematic cross-sectional view of a display panel DP illustrated in FIG. 3.

In FIGS. 3 and 4, for better understanding and ease of description, a structure of the display device DD, and of the display panel DP provided in the display device DD, is briefly illustrated based on a display area DA in which an image is to be displayed.

When the display device DD is one in which a display surface is applied to at least one surface thereof, such as a smart phone, a television, a tablet PC, a mobile phone, an image phone, an electron book reader, a desktop PC, a laptop PC, a netbook computer, a workstation, a server, a PDA, a portable multimedia player (PMP), an MP3 player, a medical device, a camera, or a wearable device, the present disclosure may be applied thereto.

Referring to FIGS. 1 to 4, the display device DD may be classified into a passive matrix type display device and an active matrix type display device according to a method of driving the light emitting element LD. For example, when the display device DD is implemented as the active matrix type display device, each of the pixels PXL may include a driving transistor for controlling an amount of current supplied to the light emitting element LD, a switching transistor for transmitting a data signal to the driving transistor, and the like.

The display panel DP (or the display device DD) may include a substrate SUB and pixels PXL disposed on the substrate SUB. Each of the pixels PXL may include at least one light emitting element LD.

The substrate SUB may include a transparent insulating material to transmit light. The substrate SUB may be a rigid substrate or a flexible substrate.

For example, the rigid substrate may be one of a glass substrate, a quartz substrate, a glass ceramic substrate, and a crystalline glass substrate.

The flexible substrate may be one of a film substrate and a plastic substrate, which includes a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

One area on the substrate SUB is provided as the display area DA in which pixels PXL are disposed, and the remaining area on the substrate SUB may be provided as a non-display area NDA. For example, the substrate SUB may have the display area DA including pixel areas in which respective pixels PXL are disposed and the non-display area NDA disposed around (e.g., around a periphery of) the display area DA (or adjacent to the display area DA).

Each of the pixels PXL may be provided in the display area DA on the substrate SUB. In an embodiment, the pixels PXL may be arranged in the display area DA in a stripe arrangement structure or the like, but they are not limited thereto.

Each pixel PXL may include a pixel circuit layer PCL, a display element layer DPL, and an optical layer LCL that are positioned on the substrate SUB.

In the pixel circuit layer PCL, a pixel circuit (see, e.g., "PXC" in FIG. 5) that is provided on the substrate SUB and includes a plurality of transistors and signal wires electrically connected to the transistors may be disposed. Each transistor, for example, may have a structure in which a semiconductor layer, a gate electrode, a first terminal, and a second terminal are sequentially stacked with an insulating layer interposed therebetween. The semiconductor layer may include an amorphous silicon, a poly silicon, a low temperature poly silicon, an organic semiconductor, and/or an oxide semiconductor. The gate electrode, the first terminal (e.g., a source electrode), and the second terminal (e.g., a drain electrode) may include one of aluminum (Al), copper (Cu), titanium (Ti), and molybdenum (Mo), but the present disclosure is not limited thereto. In addition, the pixel circuit layer PCL may include at least one or more insulating layers.

The display element layer DPL may be disposed on the pixel circuit layer PCL. An emission component (see, e.g., "EMU" in FIG. 5) including the light emitting element LD for emitting light may be positioned on the display element layer DPL. A first alignment electrode (e.g., a first alignment wire) and a second alignment electrode (e.g., a second alignment wire) spaced apart from each other may be disposed on the emission component EMU. The light emitting element LD may be disposed between the first alignment electrode and the second alignment electrode.

The optical layer LCL may be disposed on the display element layer DPL. The optical layer LCL is configured to convert light emitted from the light emitting element LD into light having excellent color reproducibility and to emit the light, thereby improving light output efficiency of each pixel PXL. The optical layer LCL may include a color converting layer and a color filter. A detailed description of the optical layer LCL will be described later with reference to FIGS. 10 and 11.

Each pixel PXL may include at least one or more light emitting elements LD driven by corresponding scan and data signals. The light emitting element LD may have a size as small as a nano-scale (or nano-meter) to a micro-scale (or micro-meter) and may be connected in parallel to light emitting elements disposed to be adjacent thereto but is not limited thereto. The light emitting element LD may form a light source of each pixel PXL.

The substrate SUB may have the display area DA and the non-display area NDA.

The display area DA may be an area in which the pixels PXL for displaying an image are provided. The non-display area NDA may be an area in which the driver for driving each pixel PXL and a portion of the wire part connecting each pixel PXL and the driver are provided.

The non-display area NDA may be disposed to be adjacent to the display area DA. The non-display area NDA may be provided on at least one side of the display area DA. For example, the non-display area NDA may surround (e.g., may surround in a plan view) a circumference (or edge) of the display area DA. The non-display area NDA may be provided with a wire part connected to each pixel PXL and a driver connected to the wire part and driving the pixel PXL.

The non-display area NDA may be an area in which wires (for example, fan-out lines LP), pads PD, and/or an embedded-in circuit part are electrically connected to the pixels PXL for driving the pixels PXL. The non-display area NDA may include a fan-out area FTA and a pad area PDA.

The pad area PDA is an area of the non-display area NDA in which a pad part PDP is positioned and may be positioned closest to an edge of the non-display area NDA. The fan-out area FTA is another area of the non-display area NDA in which the fan-out lines LP, which are a portion of the wire part, are positioned, and may be positioned adjacent to the display area DA in the non-display area NDA. For example, the fan-out area FTA may be an area of the non-display area NDA positioned between the pad area PDA and the display area DA. According to an embodiment, the non-display area NDA may include an antistatic circuit area in which an antistatic circuit that is electrically connected to the signal wires positioned in the display area DA to prevent static electricity generation is positioned. The antistatic circuit area may be an area of the non-display area NDA between the display area DA and the fan-out area FTA. In addition, in some embodiments, the non-display area NDA may have an area in which a demultiplexer is positioned.

The pad part PDP may be positioned in the pad area PDA, and the fan-out lines LP, which are a portion of the wire part, may be positioned in the fan-out area FTA.

The fan-out lines LP may be electrically connected to the pixels PXL to transmit a signal (e.g., a predetermined signal) applied from the driver to the pixels PXL. The fan-out lines LP may be positioned in the fan-out area FTA to electrically connect the driver and the pixels PXL.

The pad part PDP may include a plurality of pads PD. The pads PD may supply (e.g., transmit) driving power sources and signals for driving the pixels PXL and/or the embedded circuit part provided in the display area DA. In some embodiments, when the driver is mounted in the non-display area NDA of the substrate SUB, the pad part PDP may overlap output pads of the driver to receive signals outputted from the driver.

Figure 5:
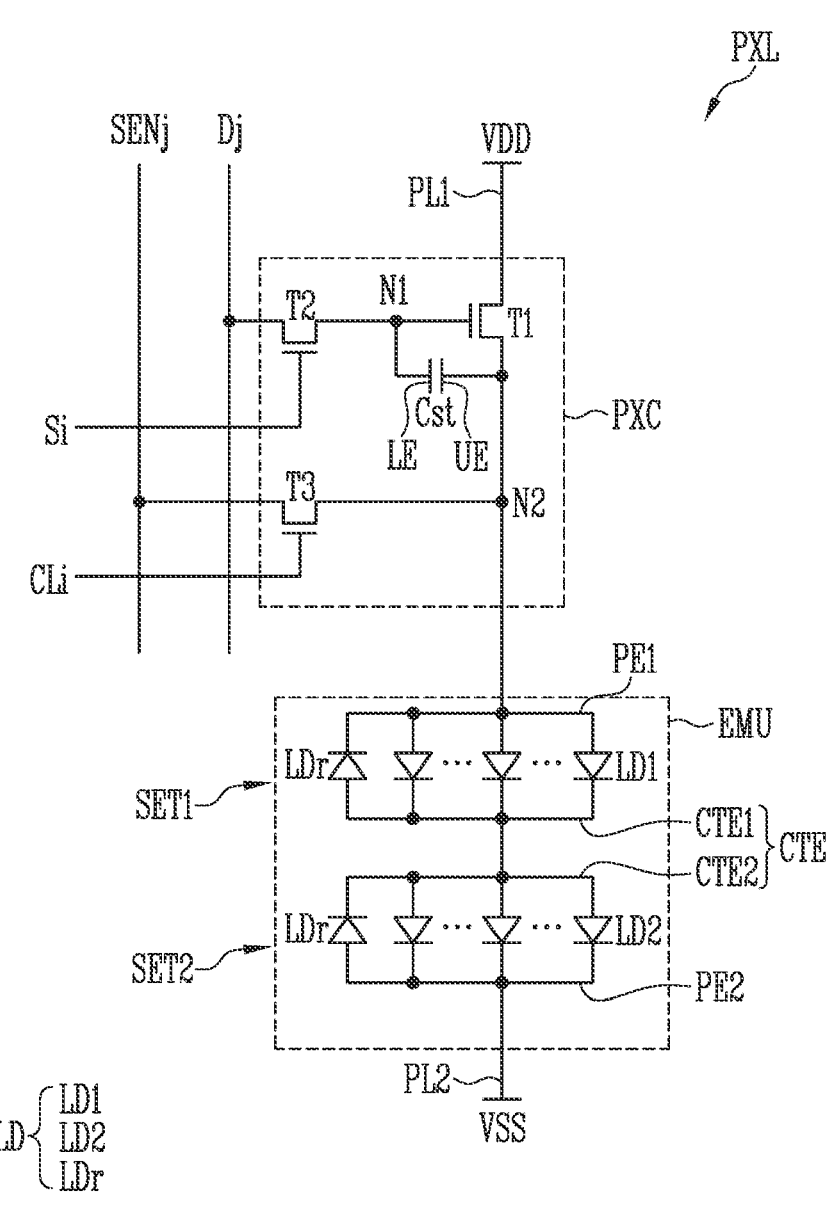
FIG. 5 illustrates a schematic circuit diagram of an electrical connection relationship of constituent elements included in each pixel illustrated in FIG. 3.

FIG. 5 illustrates a schematic circuit diagram of an electrical connection relationship of constituent elements included in each of the pixels PXL illustrated in FIG. 3.

For example, FIG. 5 illustrates to an electrical connection relationship between constituent elements included in the pixel PXL applicable to an active matrix type of a display device according to an embodiment. However, the connection relationship between the constituent elements of each pixel PXL is not limited thereto.

Referring to FIGS. 1 to 5, the pixel PXL may include the emission component EMU (or emission unit) that generates light with a luminance corresponding to a data signal. In addition, the pixel PXL may selectively further include the pixel circuit PXC for driving the emission component EMU.

In some embodiments, the emission component EMU may include a plurality of light emitting elements LD electrically connected in parallel between a first power wire PL1 that is connected to a first driving power source VDD to receive a voltage of the first driving power source VDD and a second power wire PL2 that is connected to a second driving power source VSS to receive a voltage of the second driving power source VSS. For example, the emission component EMU may include a first electrode PE1 (also referred to as a "first pixel electrode") electrically connected to the first power source VDD via the pixel circuit PXC and the first power wire PL1, a second electrode PE2 (also referred to as a "second pixel electrode") electrically connected to the second power source VSS through the second power wire PL2, and a plurality of light emitting elements LD electrically connected in parallel in the same direction between the first and second electrodes PE1 and PE2. In one embodiment, the first electrode PE1 may be an anode, and the second electrode PE2 may be a cathode.

Each of the light emitting elements LD included in the emission component EMU may have one end portion (e.g., the first end portion EP1) electrically connected to the first driving power source VDD through the first electrode PE1 and the other end portion (e.g., the second end portion EP2) electrically connected to the second driving power source VSS through the second electrode PE2. The first driving power source VDD and the second driving power source VSS may have different potentials. For example, the first driving power source VDD may be set as a high potential power source, and the second driving power source VSS may be set as a low potential power source. In such an embodiment, a potential difference between the first and second driving power sources VDD and VSS may be set to be equal to or higher than a threshold voltage of the light emitting elements LD during a light emitting period of the pixel PXL.

As described above, respective light emitting elements LD electrically connected in parallel in the same direction (for example, in a forward direction) between the first electrode PE1 and the second electrode PE2 supplied with voltages of different power sources may form respective effective light source.

The light emitting elements LD of the emission component EMU may emit light with luminance corresponding to a driving current supplied through the corresponding pixel circuit PXC. For example, during each frame period, a driving current corresponding to a gray value of corresponding frame data of the pixel circuit PXC may be supplied to the emission component EMU. The driving current supplied to the emission component EMU may be divided to flow in each of the light emitting elements LD. Therefore, while each light emitting element LD emits light with a luminance corresponding to the current flowing therein, the emission component EMU may emit light having a luminance corresponding to the driving current.

In the above-described embodiment, respective end portions of the light emitting elements LD, for example, the first and second end portions EP1 and EP2, are described as being electrically connected in the same direction between the first and second driving power sources VDD and VSS, but the present disclosure is not limited thereto. In some embodiments, the emission component EMU may further include at least one ineffective light source, for example, a reverse light emitting element LDr, in addition to the light emitting elements LD forming respective effective light sources. The reverse light emitting element LDr is electrically connected in parallel between the first and second electrodes PE1 and PE2 together with the light emitting devices LD forming the effective light sources, but may be connected between the first and second electrodes PE1 and PE2 in the opposite direction with respect to the light emitting elements LD. The reverse light emitting element LDr maintains an inactive state even when a driving voltage (e.g., a driving voltage in the forward direction) is applied between the first and second electrodes PE1 and PE2, thus a current does not substantially flow in (or through) the reverse light emitting element.

The pixel circuit PXC may be connected to a scan line Si and a data line Dj of the pixel PXL. In addition, the pixel circuit PXC may be connected to a control line CLi and a sensing line SENj of the pixel PXL. For example, when the pixel PXL is disposed to an i-th row and a j-th column of the display area DA, the pixel circuit PXC of the pixel PXL may be connected to the i-th scan line Si, the j-th data line Dj, the i-th control line CLi, and the j-th sensing line SENj of the display area DA.

The pixel circuit PXC may include first to third transistors T1 to T3 and a storage capacitor Cst.

The first transistor T1 is a driving transistor for controlling a driving current applied to the emission component EMU and may be electrically connected between the first driving power source VDD and the emission component EMU. For example, a first terminal of the first transistor T1 may be electrically connected to the first driving power source VDD through the first power wire PL1, a second terminal of the first transistor T1 may be electrically connected to a second node N2 to be electrically connected to a second storage electrode UE of the storage capacitor Cst, and a gate electrode of the first transistor T1 may be electrically connected to a first node N1. The first transistor T1 may control an amount of driving current applied to the emission component EMU from the first driving power source VDD through the second node N2 according to a voltage applied to the first node N1. In an embodiment, the first terminal of the first transistor T1 may be a drain electrode and the second terminal of the first transistor T1 may be a source electrode, but the present disclosure is not limited thereto. In some embodiments, the first terminal thereof may be a source electrode, and the second terminal thereof may be a drain electrode.

The second transistor T2 is a switching transistor that selects the pixel PXL in response to a scan signal and activates the pixel PXL and may be electrically connected between the data line Dj and the first node N1. A first terminal of the second transistor T2 may be electrically connected to the data line Dj, a second terminal of the second transistor T2 may be electrically connected to the first node N1, and a gate electrode of the second transistor T2 may be electrically connected to the scan line Si. The first terminal and the second terminal of the second transistor T2 are different terminals, and for example, when the first terminal is a drain electrode, the second terminal may be a source electrode.

When a scan signal of a gate-on voltage (e.g., a high level voltage) is supplied from the scan line Si, the second transistor T2 may be turned on to electrically connect the data line Dj and the first node N1. The first node N1 is a point at which the second terminal of the second transistor T2 is electrically connected to the gate electrode of the first transistor T1, and the second transistor T2 may transmit a data signal to the gate electrode of the first transistor T1.

The third transistor T3 electrically connects the first transistor T1 to the sensing line SENj so that it may obtain a sensing signal through the sensing line SENj and may detect a characteristic of the pixel PXL in addition to a threshold voltage of the first transistor T1 by using the sensing signal. Information on the characteristics of the pixel PXL may be used to convert image data so that a characteristic difference between the pixels PXL may be compensated. A second terminal of the third transistor T3 may be electrically connected to the second terminal of the first transistor T1, a first terminal of the third transistor T3 may be electrically connected to the sensing line SENj, and a gate electrode of the third transistor T3 may be electrically connected to the control line CLi. In addition, the first terminal of the third transistor T3 may be electrically connected to an initialization power source. The third transistor T3 is an initialization transistor configured to initialize the second node N2, and when a sensing control signal is supplied from the control line CLi, the third transistor T3 may be turned on to transmit a voltage of the initialization power source to the second node N2. Accordingly, the second storage electrode UE of the storage capacitor Cst electrically connected to the second node N2 may be initialized.

The storage capacitor Cst may include a first storage electrode LE (e.g., a lower electrode) and the second storage electrode UE (e.g., an upper electrode). The first storage electrode LE of the storage capacitor Cst may be electrically connected to the first node N1, and the second storage electrode UE of the storage capacitor Cst may be electrically connected to the second node N2. The storage capacitor Cst is charged with a data voltage corresponding to the data signal supplied to the first node N1 during one frame period. Accordingly, the storage capacitor Cst may store a voltage corresponding to a difference between a voltage of the gate electrode of the first transistor T1 and a voltage of the second node N2.

The emission component EMU may be configured to include at least one serial stage including a plurality of the light emitting elements LD electrically connected to each other in parallel. In an embodiment, the emission component EMU may be configured in a series/parallel mixed structure as shown in FIG. 5. For example, the emission component EMU may be configured to include a first serial stage SET1 and a second serial stage SET2.

The emission component EMU may include the first serial stage SET1 and the second serial stage SET2 electrically connected between the first driving power source VDD and the second driving power source VSS. Each of the first and second serial stages SET1 and SET2 may include two electrodes (e.g., PE1 and CTE1, CTE2 and PE2) configuring an electrode pair of the corresponding serial stage, and a plurality of light emitting elements LD electrically connected in parallel in the same direction between the two electrodes (e.g., PE1 and CTE1, CTE2 and PE2).

The first serial stage SET1 includes the first electrode PE1 and the first intermediate electrode CTE1, and it may include at least one first light emitting element LD1 electrically connected between the first electrode PE1 and the first intermediate electrode CTE1. In addition, the first serial stage SET1 may include a reverse direction light emitting element LDr electrically connected to the first light emitting element LD1 in an opposite direction between the first electrode PE1 and the first intermediate electrode CTE1.

The second serial stage SET2 includes the second intermediate electrode CTE2 and the second electrode PE2, and it may include at least one second light emitting element LD2 electrically connected between the second intermediate electrode CTE2 and the second electrode PE2. In addition, the second serial stage SET2 may include a reverse direction light emitting element LDr electrically connected to the second light emitting element LD2 in an opposite direction between the second intermediate electrode CTE2 and the second electrode PE2.

The first intermediate electrode CTE1 and the second intermediate electrode CTE2 may be electrically and/or physically connected. The first intermediate electrode CTE1 and the second intermediate electrode CTE2 may configure an intermediate electrode CTE that electrically connects the continuous first serial stage SET1 and second serial stage SET2.

In the above-described embodiment, the first electrode PE1 of the first serial stage SET1 may be the anode of each pixel PXL, and the second electrode PE2 of the second serial stage SET2 may be the cathode of the corresponding pixel PXL.

As described above, the emission component EMU of the pixel PXL including the serial stages SET1 and SET2 (or the light emitting elements LD) connected in a series/parallel mixed structure may easily adjust a driving current/voltage condition according to an applied product specification.

The emission component EMU of the pixel PXL including the serial stages SET1 and SET2 (or the light emitting elements LD) connected in the series/parallel mixed structure may reduce a driving current compared with an emission component having a structure in which the light emitting elements LD are connected only in parallel. In addition, the emission component EMU of the pixel PXL including the serial stages SET1 and SET2 connected in the series/parallel mixed structure may reduce a driving voltage applied to both ends of the emission component EMU compared with an emission component having a structure in which all of the light emitting elements LD of the same number are connected in series. Further, the emission component EMU of the pixel PXL including the serial stages SET1 and SET2 (or the light emitting elements LD) connected in a series/parallel mixed structure may include a greater number of light emitting elements LD between the same number of electrodes PE1, CTE1, CTE2, and PE2 than a light emitting unit having a structure in which all of the serial stages are connected in series. In such an embodiment, light emitting efficiency of the light emitting elements LD may be improved, and even if a defect occurs in a specific serial stage, a ratio of the light emitting elements LD that do not emit light due to the defect is relatively reduced, and thus, deterioration of the light emitting efficiency of the light emitting elements LD may be alleviated.

In FIG. 5, an embodiment in which the first, second, and third transistors T1, T2, and T3 included in the pixel circuit PXC are all N-type transistors is illustrated, but the present disclosure is not limited thereto. For example, at least one of the first, second, and third transistors T1, T2, and T3 described above may be changed to a P-type transistor. In addition, although FIG. 5 discloses an embodiment in which the emission component EMU is electrically connected between the pixel circuit PXC and the second driving power source VSS, the emission component EMU may also be electrically connected between the first driving power source VDD and the pixel circuit PXC.

The structure of the pixel circuit PXC may be variously changed. For example, the pixel circuit PXC may additionally include other circuit elements, such as at least one transistor element, such as a transistor element for initializing the first node N1 and/or a transistor element for controlling a light emission time of the light emitting elements LD, or a boosting capacitor for boosting the voltage of the first node N1.

In the following, for better understanding and ease of description, a horizontal direction (e.g., an X-axis direction) in a plan view is indicated as the first direction DR1, a vertical direction (e.g., a Y-axis direction) in a plan view is indicated as the second direction DR2, and a vertical direction in a cross-sectional view is indicated as the third direction DR3.

FIG. 6 illustrates a schematic top plan view of the pixel PXL illustrated in FIG. 3.

In FIG. 6, for convenience of description, the transistors electrically connected to the light emitting elements LD and the signal lines electrically connected to the transistors are omitted.

In the following embodiment, not only the constituent elements included in the pixel PXL illustrated in FIG. 6 but also the area in which the constituent elements are provided (or positioned) are comprehensively referred to as the pixel PXL.

Referring to FIGS. 1 to 6, the pixel PXL may be positioned in a pixel area PXA provided on the substrate SUB. The pixel area PXA may have an emission area EMA and a non-emission area NEA.

The pixel PXL may include a first bank BNK1 positioned in the non-emission area NEA and light emitting elements LD positioned in the emission area EMA.

The first bank BNK1 may be a structure that defines (or partitions) the pixel area PXA (or emission area EMA) of the pixel PXL and each of pixels adjacent thereto, and for example, may be a pixel defining film.

In an embodiment, the first bank BNK1 may be a pixel defining film or a dam structure that defines each emission area EMA in which the light emitting elements LD should be supplied in a process of supplying (or injecting or depositing) light emitting elements LD to the pixel PXL. For example, the emission area of the pixel PXL is partitioned by the first bank BNK1 so that a mixed solution (e.g., ink) including a target amount and/or type of light emitting element LD may be supplied to (or injected or deposited into) the emission area EMA. In some embodiments, the first bank BNK1, in a process of supplying a color converting layer (see, e.g., "CCL" in FIG. 10) to the pixel PXL, may be a pixel defining layer that defines each emission area EMA to which the color converting layer CCL is to be supplied.

In some embodiments, the first bank BNK1 may be configured to include at least one light blocking material and/or at least one reflective material (or scattering material) to prevent light leakage from occurring between the pixel PXL and pixels PXL adjacent thereto. In some embodiments, the first bank BNK1 may include a transparent material (or substance). The transparent material may include, for example, a polyamide resin, a polyimide resin, and the like, but is not limited thereto. According to other embodiments, a reflective material layer may be separately provided and/or formed on the first bank BNK1 to further improve an efficiency of light emitted from the pixel PXL.

The first bank BNK1 may have at least one opening OP exposing components positioned thereunder in the pixel area PXA. In an embodiment, the emission area EMA of the pixel PXL and the opening OP in the first bank BNK1 may correspond to each other.

An electrode separating area OPA may be positioned in the non-emission area NEA of each pixel PXL. The electrode separating area OPA may be an area in which a first alignment electrode ALE1 in each pixel PXL is separated from a first alignment electrode ALE1 provided in the pixel PXL adjacent in the second direction DR2.

The display element layer DPL includes an electrode PE (e.g., a pixel electrode) provided in the emission area EMA, light emitting elements LD electrically connected to the electrode PE, and alignment electrodes ALE provided at positions corresponding to the electrode PE. For example, in the emission area EMA, a first electrode PE1 (e.g., first pixel electrode), a second electrode PE2 (e.g., second pixel electrode), light emitting elements LD, and first and second alignment electrodes ALE1 and ALE2 are disposed. In addition, the intermediate electrode CTE may be disposed in the emission area EMA. The number, shape, size, and arrangement of the electrodes PE and/or the alignment electrodes ALE may be variously changed according to the structure of the pixel (PXL), such as according to changes in the emission component EMU.

In an embodiment, the alignment electrodes ALE, the light emitting elements LD, and the electrodes PE may be sequentially provided based on one surface of the substrate SUB on which the pixel PXL is provided, but the present disclosure is not limited thereto. In some embodiments, the position and the shape order of the electrode patterns configuring the pixel PXL (or the emission component EMU) may be variously changed. The stacked structure of the pixel PXL will be described later with reference to FIGS. 7 to 12.

The alignment electrodes ALE may be positioned in at least the emission area EMA, may be spaced apart from each other in the first direction DR1 in the emission area EMA and may respectively extend in the second direction DR2. The alignment electrodes ALE may include the second alignment electrode ALE2, the first alignment electrode ALE1, and another second alignment electrode ALE2 arranged to be spaced apart from each other in the first direction DR1.

At least one of the second alignment electrode ALE2, the first alignment electrode ALE1, and another second alignment electrode ALE2 may be separated from another electrode (e.g., the alignment electrode ALE provided in the adjacent pixel PXL adjacent to each pixel PXL in the second direction DR2), after the light emitting elements LD are supplied and aligned in the emission area EMA during the manufacturing process of the display device DD. As an example, the first alignment electrode ALE1 may be separated from the first alignment electrode ALE1 provided in the adjacent pixels PXL adjacent to the corresponding pixel PXL after the light emitting elements LD are supplied and aligned in the emission area EMA during the manufacturing process of the display device DD.

For example, the first alignment electrodes ALE1 provided in the display area DA may be formed to be connected to each other in a manufacturing process of the display device DD (or the pixel PXL). For example, the first alignment electrodes ALE1 may be formed to be integrally connected with a floating pattern FTP to configure a first alignment wire. The floating pattern FTP may be electrically connected to some components of the pixel circuit layer PCL, for example, the first power wire (see, e.g., "PL1" in FIG. 5) through a third via hole (e.g., a third via opening) VIH3. In the alignment process of the light emitting elements LD, the first alignment signal may be supplied to the first alignment wire through the first power wire PL1. After the alignment process of the light emitting elements LD (e.g., after the process of aligning the light emitting elements LD) is completed, a portion of the first alignment wire is removed (e.g., the first alignment wire is cut) from the periphery of the third via hole VIH3 positioned in the non-emission area NEA so that an electrical connection between the first alignment electrodes ALE1 and the first power wire PL1 is disconnected. For example, by cutting the first alignment wire in the electrode separating area OPA positioned around the floating pattern FTP, the first alignment wire may be separated into the first alignment electrodes ALE1 and the floating patterns FTP. In addition, the first alignment electrodes ALE1 of the adjacent pixels PXL may be separated by cutting the first alignment line in the electrode separating area OPA between the adjacent pixel columns. Accordingly, the first alignment electrodes ALE1 of the pixels PXL positioned in the same pixel column are electrically separated from each other so that the pixels PXL may be individually driven.

When viewed in a plan view, the second alignment electrode ALE2, the first alignment electrode ALE1, and another second alignment electrode ALE2 may be arranged along the first direction DR1 in the emission area EMA. The second alignment electrode ALE2 may be positioned adjacent to one side (e.g., the left side) of the first alignment electrode ALE1, and the another second alignment electrode ALE2 may be positioned adjacent to the other side (e.g., the right side) of the first alignment electrode ALE1.

The first alignment electrode ALE1 may be electrically connected to a second storage electrode (see, e.g., "UE" in FIG. 5) of some components of the pixel circuit PXC, for example, the storage capacitor (see, e.g., "Cst" in FIG. 5) through a second via hole (e.g., a second via opening) VIH2. The second via hole VIH2 may be formed by removing a partial area of an insulating layer positioned between the first alignment electrode ALE1 and the second storage electrode UE.

Another second alignment electrode ALE2 may be electrically connected to some components of the pixel circuit PXC, for example, the second power wire PL2 through a first via hole (e.g., a first via opening) VIH1. The first via hole VIH1 may be formed by removing a partial area of an insulating layer positioned between the another second alignment electrode ALE2 and the second power wire PL2.

Each of the second alignment electrode ALE2, the first alignment electrode ALE1, and the another second alignment electrode ALE2 in the emission area EMA may be disposed to be spaced apart from the adjacent alignment electrode ALE in the first direction DR1. The second alignment electrodes ALE2 may be integrally formed with second alignment electrodes ALE2 positioned in the adjacent pixel PXL.

Each of the second alignment electrode ALE2, the first alignment electrode ALE1, and the another second alignment electrode ALE2 may receive a signal (e.g., an alignment signal and/or a predetermined signal) before the light emitting elements LD are aligned in the emission area EMA of each pixel PXL, and may be used as an alignment wire for aligning light emitting elements LD.

The first alignment electrode ALE1 may receive the first alignment signal in the alignment step of the light emitting elements LD, and the second alignment electrode ALE2 and the another second alignment electrode ALE2 may receive the second alignment signal in the alignment step of the light emitting elements LD. The above-described first and second alignment signals may be signals having a voltage difference and/or a phase difference sufficient to align the light emitting elements LD between the alignment electrodes ALE. At least one of the first and second alignment signals may be an AC signal but is not limited thereto.

The second alignment electrode ALE2, the first alignment electrode ALE1, and the another second alignment electrode ALE2 may be provided in a bar shape having a constant width in the at least emission area EMA, but they are not limited thereto. The second alignment electrode ALE2, the first alignment electrode ALE1, and the another second alignment electrode ALE2 may or may not have a curved portion in the non-emission area NEA and a shape and/or size of an area other than the emission area EMA is not particularly limited and may be variously changed.

A bank pattern for changing a surface profile (or shape) of the alignment electrodes ALE to guide light emitted from the light emitting elements LD in an image display direction of the display device DD may be positioned under each of the above-described alignment electrodes ALE. Such a bank pattern will be described later with reference to FIG. 7 to FIG. 12.

At least two to several tens of light emitting elements LD may be aligned and/or provided in the emission area EMA (or the pixel area PXA), but the number of the light emitting elements LD is but is not limited thereto. In some embodiments, the number of light emitting elements LD aligned and/or provided in the emission area EMA (or the pixel area PXA) may be variously changed.

The light emitting elements LD may be respectively disposed between the second alignment electrode ALE2 and the first alignment electrode ALE1 and between the first alignment electrode ALE1 and another second alignment electrode ALE2. When viewed in a plan view, each of the light emitting elements LD may include a first end portion EP1 and a second end portion EP2 positioned (or facing each other) at respective ends thereof in a length direction thereof, for example, the first direction DR1. In an embodiment, a second semiconductor layer (see, e.g., "13" in FIG. 1)

including a p-type semiconductor layer may be positioned at the first end portion EP1 (or the p-type end portion), and a first semiconductor layer (see, e.g., "11" in FIG. 1) including an n-type semiconductor layer may be positioned at the second end portion EP2 (or the n-type end portion). The light emitting elements LD may be electrically connected in parallel to each other between the second alignment electrode ALE2 and the first alignment electrode ALE1 and between the first alignment electrode ALE1 and another second alignment electrode ALE2, respectively.

The light emitting elements LD may be disposed to be spaced apart from each other and may be aligned substantially parallel to each other. A distance at which the light emitting elements LD are spaced apart from each other is not particularly limited. In some embodiments, a plurality of light emitting elements LD are disposed adjacent to each other to form a group, and a plurality of other light emitting elements LD may be grouped in a state of being spaced apart from each other by a distance (e.g., a predetermined distance), and may have non-uniform density and may also be aligned in one direction.

The light emitting elements LD may be injected (or supplied) into the pixel area PXA (or emission area EMA) through various methods including an inkjet printing method and a slit coating method. For example, the light emitting elements LD may be mixed with a volatile solvent and then injected (or supplied) into the pixel area PXA through an inkjet printing method or a slit coating method. In such embodiments, when a corresponding alignment signal is applied to each of the second alignment electrode ALE2, the first alignment electrode ALE1, and the another second alignment electrode ALE2, an electric field may be formed between the second alignment electrode ALE2 and the first alignment electrode ALE1 and between the first alignment electrode ALE1 and the another second alignment electrode ALE2, respectively. Accordingly, the light emitting elements LD may be aligned between the second alignment electrode ALE2 and the first alignment electrode ALE1 and between the first alignment electrode ALE1 and the another second alignment electrode ALE2, respectively. After the light emitting elements LD are aligned, the light emitting elements LD may be stably arranged between the alignment electrodes ALE by volatilizing the solvent or removing (or eliminating) it in other ways.

In some embodiments, the light emitting elements LD may include a first light emitting element LD1 and a second light emitting element LD2.

The first light emitting element LD1 may be aligned between the right side of the first alignment electrode ALE1 and the another second alignment electrode ALE2 to be electrically connected to the first electrode PE1 and the intermediate electrode CTE. The second light emitting element LD2 may be aligned between the left side of the first alignment electrode ALE1 and the second alignment electrode ALE2 to be electrically connected to the intermediate electrode CTE and the second electrode PE2.

A plurality of first light emitting elements LD1 and second light emitting elements LD2 may be provided. The first end portion EP1 of each of the plurality of first light emitting elements LD1 may be electrically connected to the first electrode PE1, and the second end portion EP2 of each of the plurality of first light emitting elements LD1 may be electrically connected to the intermediate electrode CTE. The first end portion EP1 of each of the plurality of second light emitting elements LD2 may be electrically connected to the intermediate electrode CTE, and the second end portion EP2 of each of the plurality of second light emitting elements LD2 may be electrically connected to the second electrode PE2.

The plurality of first light emitting elements LD1 may be mutually connected in parallel between the first electrode PE1 and the intermediate electrode CTE, and the plurality of second light emitting elements LD2 may be mutually connected in parallel between the intermediate electrode CTE and the second electrode PE2.

The electrodes PE and the intermediate electrode CTE may be provided in the at least emission area EMA of the pixel PXL and may be provided at positions corresponding to at least one alignment electrode ALE and the light emitting elements LD, respectively. For example, each electrode PE and each intermediate electrode CTE may be formed on each alignment electrode ALE and a corresponding light emitting elements LD to overlap each alignment electrode ALE and the corresponding light emitting elements LD to be electrically connected to at least light emitting elements LD.

The electrodes PE may include a first electrode PE1 and a second electrode PE2 disposed to be spaced apart from each other.

The first electrode PE1 (e.g., the "first pixel electrode" or "anode") may be formed on the left side of the first alignment electrode ALE1 and on the first end portion EP1 of each of the first light emitting elements LD1 to be electrically connected to the first end portion EP1 of each of the first light emitting elements LD1. The first electrode PE1 may have a bar shape having a constant width along an extension direction thereof, for example, the second direction DR2.

The second electrode PE2 (e.g., the "second pixel electrode" or "cathode") may be formed on the second alignment electrodes ALE2 and on the second end portion EP2 of each of the second light emitting elements LD2 to be electrically connected to the second end portion EP2 of each of the second light emitting elements LD2. The second electrode PE2 may have a bar shape having a constant width along an extension direction thereof, for example, the second direction DR2.

The intermediate electrode CTE may be formed on the another second alignment electrodes ALE2 and on the second end portion EP2 of each of the first light emitting elements LD1 to be electrically connected to the second end portion EP2 of each of the first light emitting elements LD1. In addition, the intermediate electrode CTE may be formed on the right side of the first alignment electrode ALE1 and on the first end portion EP1 of each of the second light emitting elements LD2 to be electrically connected to the first end portion EP1 of each of the second light emitting elements LD2. The intermediate electrode CTE may have a shape bent at least once or more to surround at least one side of the first electrode PE1 when viewed in a plan view.

The first light emitting element LD1 may be electrically connected in series to the second light emitting element LD2 through the intermediate electrode CTE. The first electrode PE1 and the intermediate electrode CTE may configure the first series terminal SET1 of the emission component EMU together with the first light emitting elements LD1 electrically connected in parallel therebetween. The intermediate electrode CTE and the second electrode PE2 may configure the second serial terminal SET2 of the emission component EMU together with the second light emitting elements LD2 electrically connected in parallel therebetween.

In an embodiment, the first electrode PE1 may contact the first alignment electrode ALE1 through a first contact hole (e.g., a first contact opening) CH1 in at least the non-emission area NEA to be electrically and/or physically connected to the first alignment electrode ALE1. The first contact hole CH1 may be formed by removing a portion of at least one insulating layer positioned between the first electrode PE1 and the first alignment electrode ALE1, and a portion of the first alignment electrode ALE1 may be exposed by the first contact hole CH1. It has been described that the first contact hole CH1, which is a connection point (or contact point) between the first electrode PE1 and the first alignment electrode ALE1, is positioned in the non-emission area NEA, but the present disclosure is not limited thereto. In some embodiments, the connection point (or contact point) between the first electrode PE1 and the first alignment electrode ALE1 may be positioned in the emission area EMA of the pixel PXL.

The pixel circuit PXC, the first alignment electrode ALE1, and the first electrode PE1 may be electrically connected through the second via hole VIH2 and the first contact hole CH1. In the above embodiment, it has been described that the first alignment electrode ALE1 and the first electrode PE1 are directly contacted and connected through the first contact hole CH1, but the present disclosure is not limited thereto. In some embodiments, to prevent a defect due to material characteristics of the first alignment electrode ALE1, the first electrode PE1 may be in direct contact with the pixel circuit PXC, without directly contacting the first alignment electrode ALE1, to be electrically connected to the pixel circuit PXC.

The second electrode PE2 may directly contact the second alignment electrode ALE2 through a second contact hole (e.g., a second contact opening) CH2 to be electrically and/or physically connected to the second alignment electrode ALE2. The second contact hole CH2 may be formed by removing a portion of at least one insulating layer positioned between the second electrode PE2 and the second alignment electrode ALE2, and a portion of the second alignment electrode ALE2 may be exposed by the second contact hole CH2. In some embodiments, the second contact hole CH2, which is the connection point (or contact point) between the second electrode PE2 and the second alignment electrode ALE2, may be positioned in the emission area EMA of the pixel PXL.

The second power wire PL2, the second alignment electrode ALE2, and the second electrode PE2 may be electrically connected to each other through the first via hole VIH1 and the second contact hole CH2.

In the above embodiment, it has been described that the second alignment electrode ALE2 and the second electrode PE2 directly contact and are connected through the second contact hole CH2, but the present disclosure is not limited thereto. In some embodiments, to prevent a defect due to material characteristics of the second alignment electrode ALE2, the second electrode PE2 may directly contact the second power wire PL2 without directly contacting the second alignment electrode ALE2 to be electrically connected to the second power wire PL2.

Hereinafter, a stacked structure of the pixel PXL according to embodiments of the present disclosure will be primarily described with reference to FIG. 7 to FIG. 12.

FIG. 7 to FIG. 11 illustrate schematic cross-sectional views taken along the line II-II' of FIG. 6, FIG. 12 illustrates a schematic cross-sectional view taken along the line III-III' of FIG. 6, FIG. 13A illustrates a schematic enlarged view of the portion EA1 of FIG. 12, FIG. 13B illustrates a schematic drawing of a second conductive pattern CP1 and a via layer VIA shown in FIG. 13A viewed from above, FIG. 14A and FIG. 14B illustrate schematic enlarged views of the portion EA2 of FIG. 12, FIG. 14C illustrates a schematic drawing of a first conductive pattern CP1 and a via layer VIA shown in FIG. 14A viewed from above, and FIG. 15 illustrates a schematic cross-sectional view taken along the line IV-IV' of FIG. 6.

Figure 7:
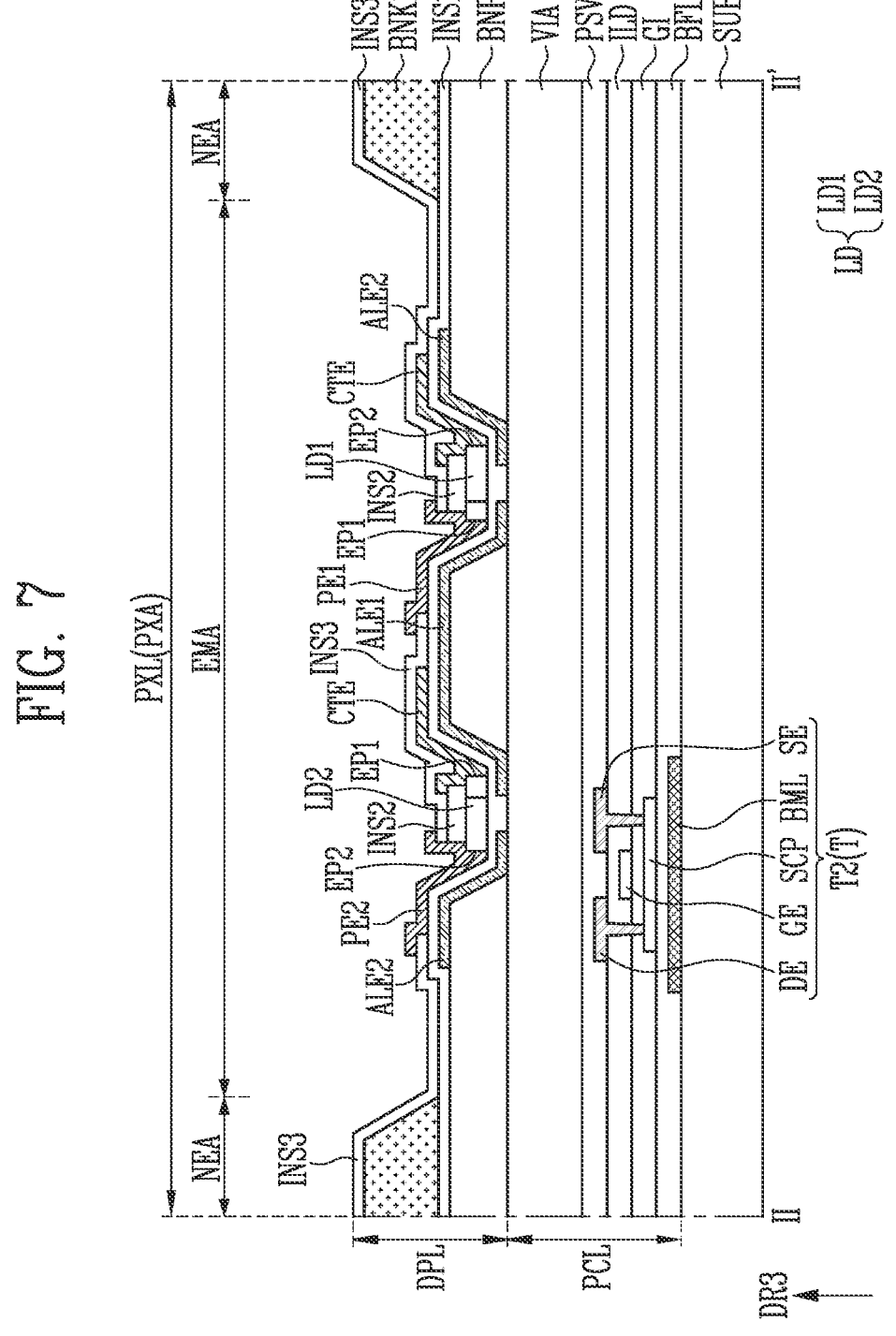
Figure 8:
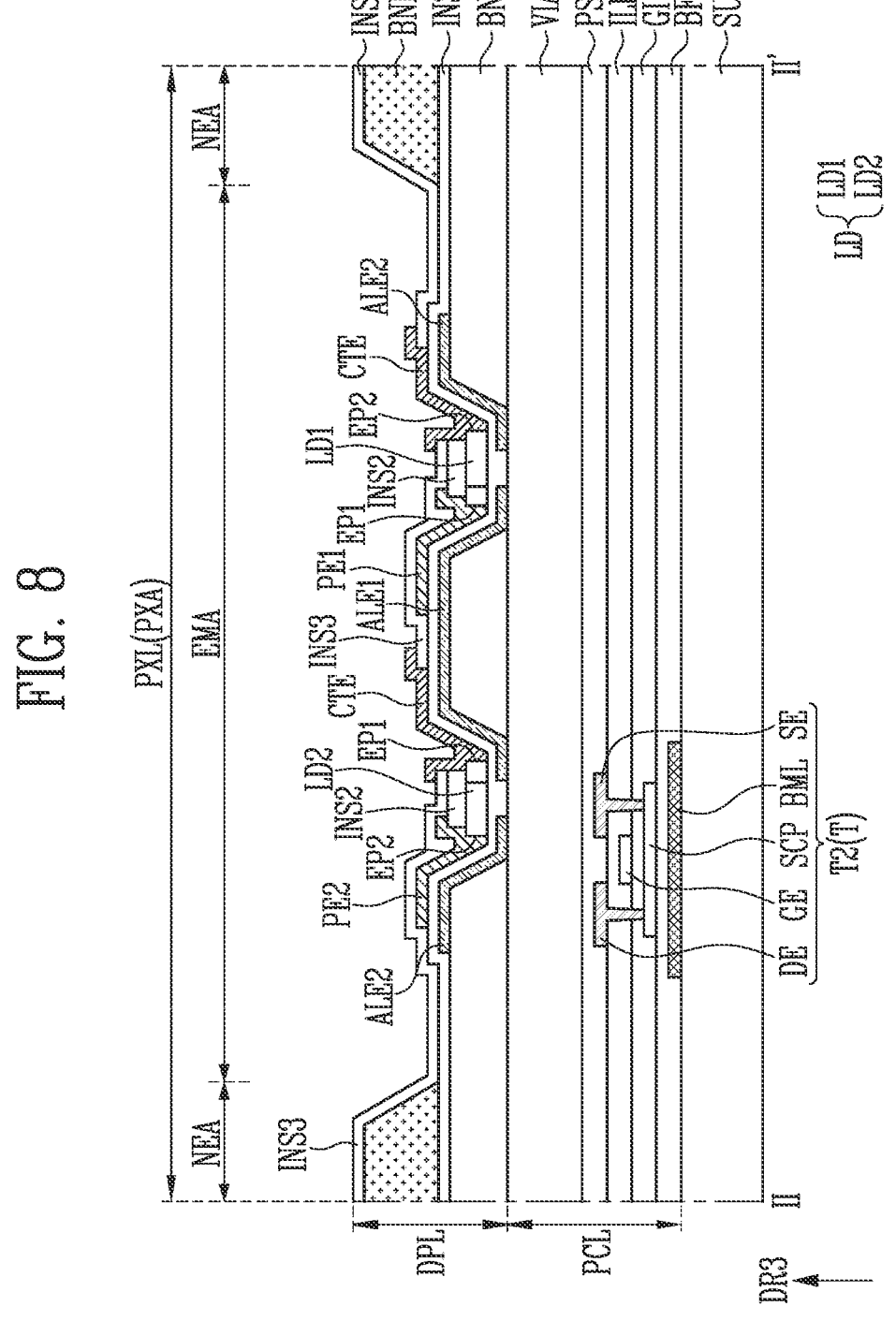
Figure 9:
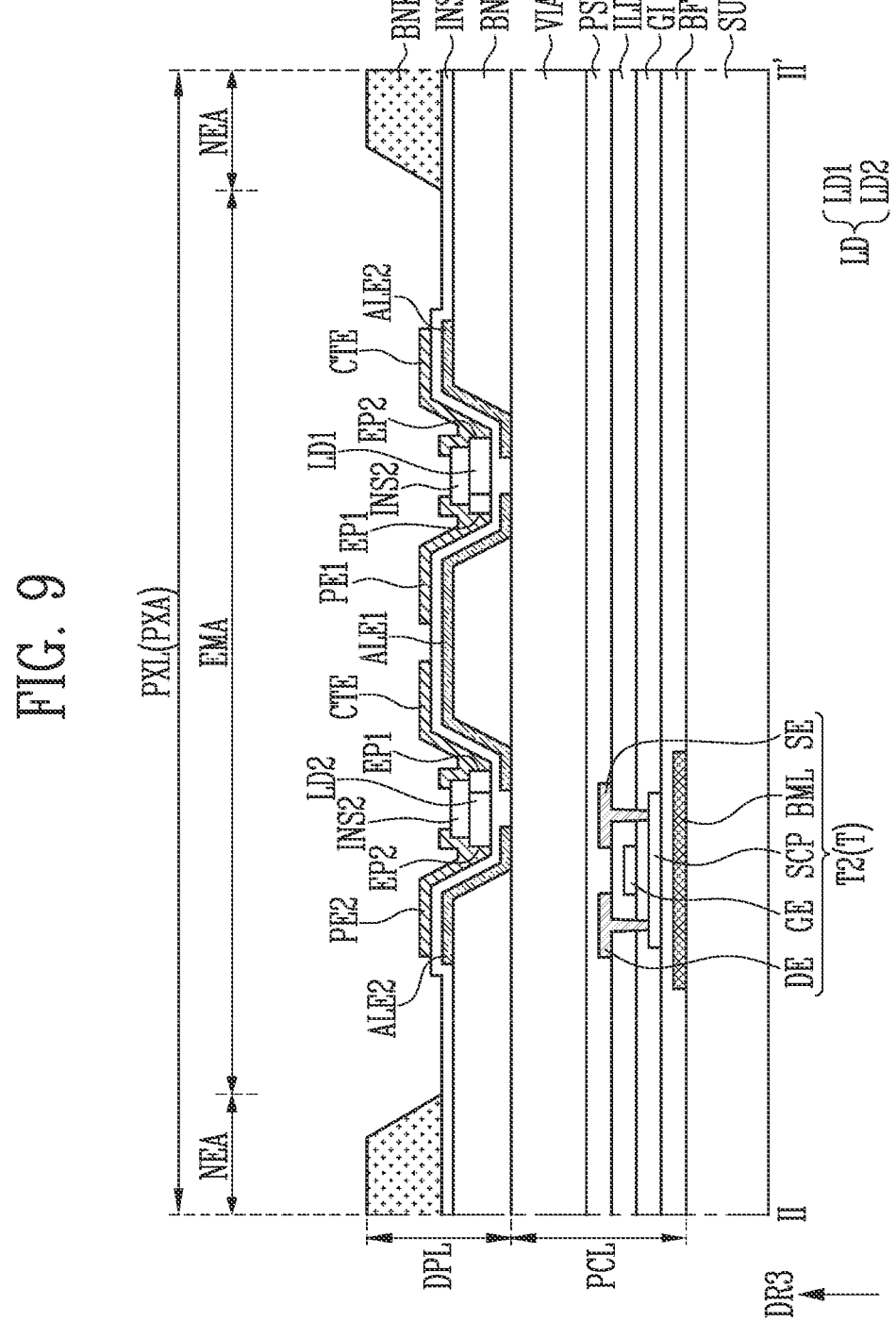

The embodiments shown in FIG. 8 and FIG. 9 show variations of the embodiment shown in FIG. 7 with respect to the formation step of the electrode PE and the intermediate electrode CTE and the presence or absence of a third insulating layer INS3. For example, FIG. 8 shows an embodiment in which the intermediate electrode CTE is formed after the first and second electrodes PE1 and PE2 and the third insulating layer INS3 are formed, and FIG. 9 shows an embodiment in which the first and second electrodes PE1 and PE2 and the intermediate electrode CTE are formed by the same process.

Figure 10:
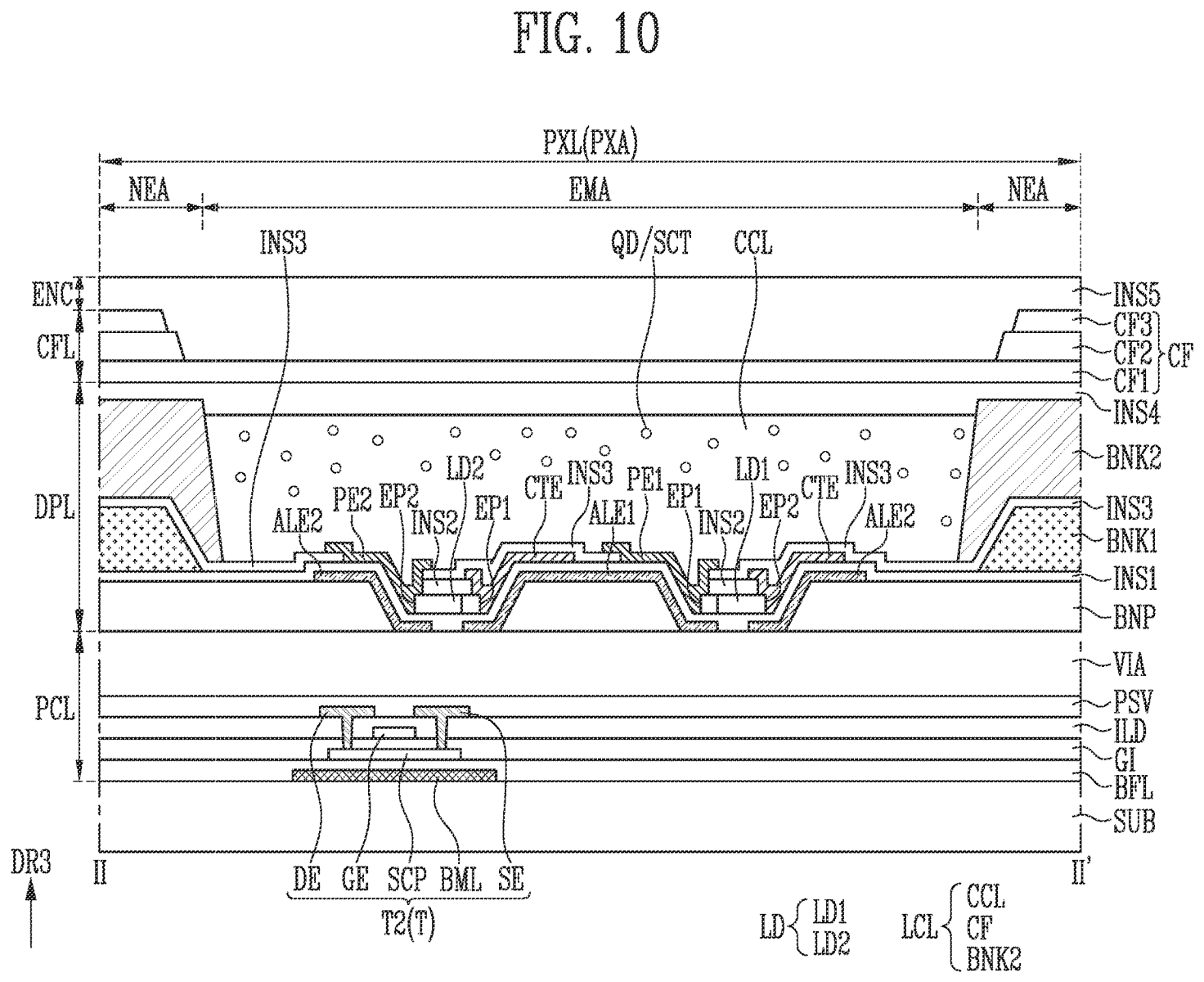
Figure 11:
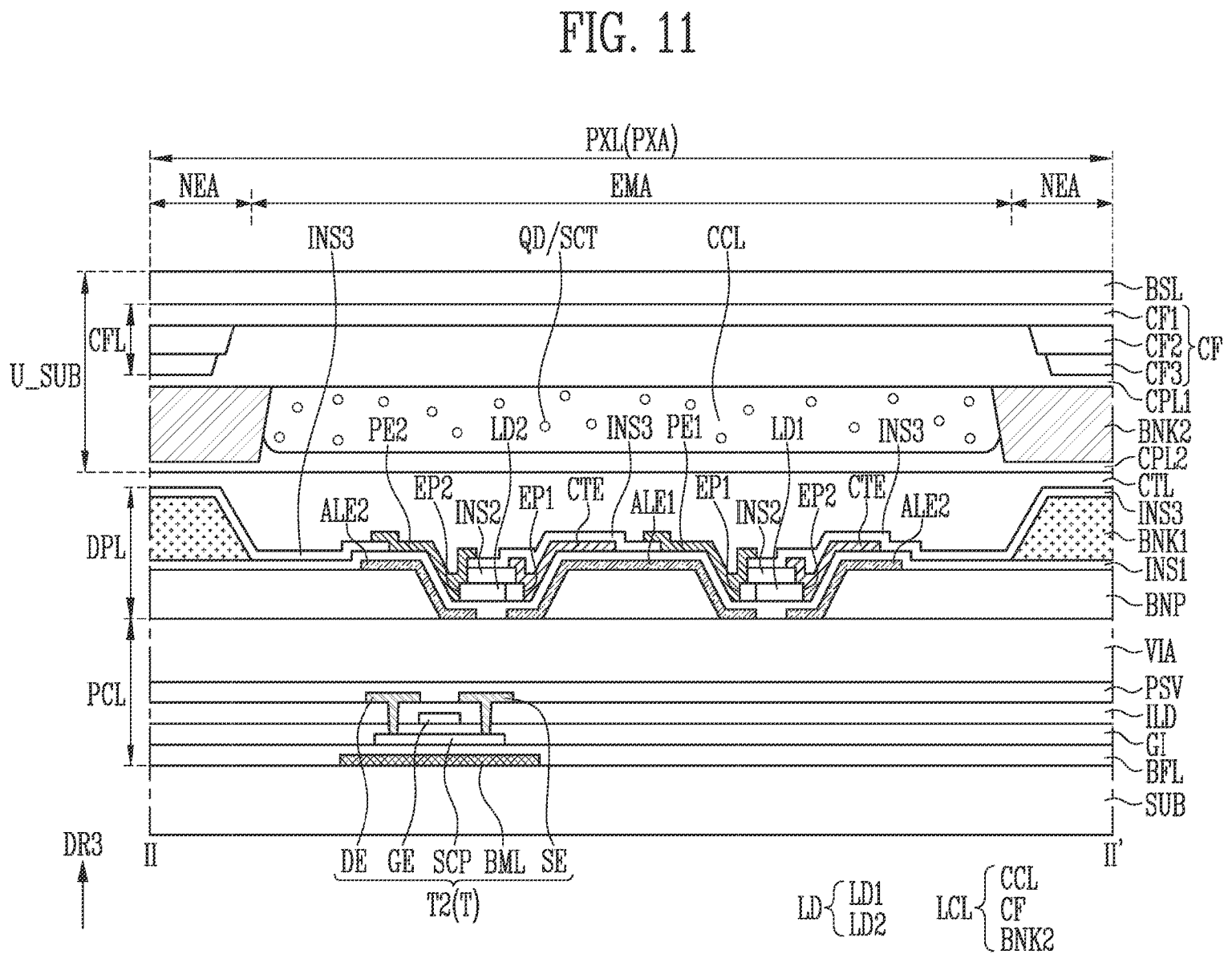

The embodiments shown in FIG. 10 and FIG. 11 show variations of the embodiment shown in FIG. 7 in relation to the presence or absence and position of the optical layer LCL. For example, FIG. 10 illustrates an embodiment in which the optical layer LCL including a color converting layer CCL and a color filter CF is positioned on the first and second electrodes PE1 and PE2 through a continuous process, and FIG. 11 illustrates an embodiment in which the optical layer LCL including a color converting layer CCL and a color filter CF is positioned on the display element layer DPL through an adhesion process using an intermediate layer CTL.

In FIG. 13B and FIG. 14C, for better comprehension and ease of description, a pattern for identifying a second area VIA_b of the via layer VIA is applied.

In the embodiments described with respect to FIGS. 7 to 15, the stacked structure of the pixel PXL is simplified and shown, such as by showing each electrode as a single film and by showing each insulating layer as a single film when the present disclosure is not limited thereto.

In connection with the following description of the embodiments shown in FIGS. 7 to 15, differences from the above-described embodiment will be primarily described to avoid duplicate descriptions.

Referring to FIGS. 1 to 15, the pixel PXL may include the substrate SUB, the pixel circuit layer PCL, and the display element layer DPL.

The pixel circuit layer PCL and the display element layer DPL may be disposed to overlap each other on one surface of the substrate SUB. For example, in the display area DA of the substrate SUB, the pixel circuit layer PCL may be disposed on one surface of the substrate SUB and the display element layer DPL may be disposed on the pixel circuit layer PCL. However, mutual positions of the pixel circuit layer PCL and the display element layer DPL on the substrate SUB may be changed according to embodiments. When the pixel circuit layer PCL and the display element layer DPL are formed as separate layers and overlap each other, respective layout spaces for forming the pixel circuit PXC and the emission component EMU in a plan view may be sufficiently secured.

The substrate SUB may include a transparent insulating material to transmit light. The substrate SUB may be a rigid substrate or a flexible substrate.

In each pixel area PXA of the pixel circuit layer PCL, circuit elements (e.g., transistors T) configuring the pixel circuit PXC of the corresponding pixel PXL and signal lines (e.g., predetermined signal lines) electrically connected to the circuit elements may be disposed. In addition, the alignment electrodes ALE, the light emitting elements LD, and/or the electrodes PE configuring the emission component EMU of the corresponding pixel PXL may be disposed in each pixel area PXA of the display element layer DPL.

The pixel circuit layer PCL may include at least one insulating layer in addition to the circuit elements and the signal lines. For example, the pixel circuit layer PCL may include a buffer layer BFL, a gate insulating layer GI, an interlayer insulating layer ILD, a passivation layer PSV, and a via layer VIA that are sequentially stacked on the substrate SUB in a third direction DR3.

The buffer layer BFL may be entirely disposed on the substrate SUB. The buffer layer BFL may prevent impurities from being diffused into the transistors T included in the pixel circuit PXC. The buffer layer BFL may be an inorganic insulating film including an inorganic material. The buffer layer BFL may include at least one of a silicon nitride ($SiN_x$), a silicon oxide ($SiO_x$), a silicon oxynitride ($SiO_xN_y$), and an aluminum oxide ($AlO_x$). The buffer layer BFL may be provided as a single film but may also be provided as a multifilm of two or more films. When the buffer layer BFL is provided as the multi-film, respective layers thereof may be made of the same material or different materials. The buffer layer BFL may be omitted depending on the material, a process condition, and the like of the substrate SUB.

The gate insulating layer GI may be entirely disposed on the buffer layer BFL. The gate insulating layer GI may include the same material as the above-described buffer layer BFL or may include a material suitable (or selected) from materials described as constituent materials of the buffer layer BFL. For example, the gate insulating layer GI may be an inorganic insulating film including an inorganic material.

The interlayer insulating layer ILD may be entirely provided and/or formed on the gate insulating layer GI. The interlayer insulating layer ILD may include the same material as that of the buffer layer BFL or may include one or more materials suitable (or selected) from the materials described as constituent materials of the buffer layer BFL.

The passivation layer PSV may be entirely provided and/or formed on the interlayer insulating layer ILD. The passivation layer PSV may include the same material as that of the gate insulating layer GI or may include one or more materials suitable (or selected) from the materials described as constituent materials of the gate insulating layer GI.

The passivation layer PSV may be partially opened (e.g., may have one or more openings therein) to expose some components of the pixel circuit PXC. For example, the passivation layer PSV may have a first opening OPN1 exposing an area of the first conductive pattern CP1, a second opening OPN2 exposing an area of the second conductive pattern CP2, and a third opening OPN3 exposing an area of the third conductive pattern CP3.

The via layer VIA may be entirely provided and/or formed on the passivation layer PSV. The via layer VIA may be an inorganic insulating film including an inorganic material or an organic insulating film including an organic material. The inorganic insulating film may include, for example, at least one of a silicon oxide ($SiO_x$), a silicon nitride ($SiN_x$), a silicon oxynitride ($SiO_xN_y$), an aluminum oxide ($AlO_x$). The organic insulating film may be, for example, at least one of a polyacrylate resin, an epoxy resin, a phenolic resin, a polyamide resin, a polyimide rein, an unsaturated polyester resin, a polyphenylene ether resin, a poly-phenylene sulfide resin, and a benzocyclobutene resin.

The via layer VIA may include a plurality of via holes (e.g., via openings) VIH. For example, the via layer VIA may be partially opened to include first, second, and third via holes VIH1, VIH2, and VIH3 corresponding to the first, second, and third openings OPN1, OPN2, and OPN3 of the passivation layer PSV. For example, the first via hole VIH1 of the via layer VIA may correspondingly overlap (e.g., may be aligned with in the third direction DR3) the first opening OPN1 of the passivation layer PSV, the second via hole VIH2 of the via layer VIA may correspondingly overlap the second opening OPN2 of the passivation layer PSV, and the third via hole VIH3 of the via layer VIA may correspondingly overlap the third opening OPN3 of the passivation layer PSV.

In an embodiment, the via layer VIA may be a planarization layer for alleviating (or smoothing) a step caused by components of the pixel circuit PXC positioned thereunder in the pixel circuit layer PCL.

The pixel circuit PXC may include at least one transistor T disposed on the buffer layer BFL. For example, the pixel circuit PXC may include a first transistor T1 (e.g., a driving transistor) for controlling a driving current of the light emitting elements LD and a second transistor T2 (e.g., a switching transistor) electrically connected to the first transistor T1. The first transistor T1 may be the first transistor T1 described with reference to FIG. 5, and the second transistor T2 may be the second transistor T2 described with reference to FIG. 5. However, the present disclosure is not limited thereto, and the pixel circuit PXC may further include other circuit elements for performing other functions in addition to the first transistor T1 and the second transistor T2. In the following embodiment, the first transistor T1 and the second transistor T2 are collectively referred to as the transistor T or the transistors T.

The transistor T may include a semiconductor pattern SCP, a gate electrode GE overlapping a portion of the semiconductor pattern SCP, and source and drain electrodes SE and DE electrically connected to the semiconductor pattern SCP.

The gate electrode GE may be provided and/or formed on the gate insulating layer GI. The gate electrode GE may overlap a portion of the semiconductor pattern SCP. For example, the gate electrode GE may overlap an active pattern of the semiconductor pattern SCP.

The semiconductor pattern SCP may be provided and/or formed on the buffer layer BFL. For example, the semiconductor pattern SCP may be positioned between the buffer layer BFL and the gate insulating layer GI. The semiconductor pattern SCP may be a semiconductor layer made of a polysilicon, an amorphous silicon, an oxide semiconductor, or the like. The semiconductor pattern SCP may include an active pattern, a first contact area, and a second contact area. The active pattern, the first contact area, and the second contact area may be formed of a semiconductor layer in which an impurity is not doped or an impurity is doped. For example, the first contact area and the second contact area may be formed of a semiconductor layer doped with an impurity, and the active pattern may be formed of a semiconductor layer that is not doped with an impurity. As for the impurity, for example, an n-type impurity may be used, but the present disclosure is not limited thereto.

The active pattern of the semiconductor pattern SCP may be a channel area that is an area overlapping the gate electrode GE of the corresponding transistor T. The first contact area of the semiconductor pattern SCP may contact one end of the active pattern. In addition, the first contact area may be connected to the source electrode SE. The second contact area of the semiconductor pattern SCP may contact the other end of the active pattern. In addition, the second contact area may be connected to the drain electrode DE.

The source electrode SE may be provided and/or formed on the interlayer insulating layer ILD. The source electrode SE may contact the first contact area of the semiconductor pattern SCP through a contact hole (e.g., a contact opening) penetrating the gate insulating layer GI and the interlayer insulating layer ILD. The source electrode SE of the first transistor T1 may be integrally formed with the second conductive pattern CP2 to be electrically connected to the second conductive pattern CP2. The second conductive pattern CP2 may be the second storage electrode UE of the storage capacitor Cst described with reference to FIG. 5.

The drain electrode DE may be provided and/or formed on the interlayer insulating layer ILD. The drain electrode DE may be disposed to be spaced apart from the source electrode SE on the interlayer insulating layer ILD. The drain electrode DE may contact the second contact area of the semiconductor pattern SCP through a contact hole (e.g., a contact opening) penetrating the gate insulating layer GI and the interlayer insulating layer ILD.

A bottom metal pattern BML may be disposed under the first transistor T1.

The bottom metal pattern BML may be a first conductive layer positioned between the substrate SUB and the buffer layer BFL. The bottom metal pattern BML may be electrically connected to the transistor T. In such an embodiment, a driving range of a voltage (e.g., a predetermined voltage) supplied to a gate electrode GE of the transistor T may be widened. The bottom metal pattern BML may be electrically connected to the semiconductor pattern SCP terminal of the transistor T to stabilize a channel area of the transistor T. In addition, because the bottom metal pattern BML is electrically connected to the transistor T, the bottom metal pattern BML may be prevented from floating.

An embodiment in which the transistor T is a thin film transistor having a top gate structure is described above as an example, but the present disclosure is not limited thereto and the structure of the transistor T may be variously changed.

The bottom metal pattern BML may be formed to have a single film structure of a single material or a mixture thereof selected from a group consisting of copper (Cu), molybdenum (Mo), tungsten (W), aluminum neodymium (AlNd), titanium (Ti), aluminum (Al), silver (Ag), and an alloy thereof. In other embodiments, to reduce wire resistance, the bottom metal pattern BML may be formed to have a double film or multi-film structure of molybdenum (Mo), titanium (Ti), copper (Cu), aluminum (Al) or silver (Ag), which are low-resistance materials.

The pixel circuit layer PCL may include the first, second, and third conductive patterns CP1, CP2, and CP3 disposed on the interlayer insulating layer ILD. The first, second, and third conductive patterns CP1, CP2, and CP3 may be disposed to be spaced apart from each other on the interlayer insulating layer ILD.

The first conductive pattern CP1 may be the second power wire PL2 to which the voltage of the second driving power source VSS is applied. The first conductive pattern CP1 may be electrically connected to the second alignment electrode ALE2 of the display element layer DPL through the first opening OPN1 in the passivation layer PSV and the first via hole VIH1 in the via layer VIA.

The second conductive pattern CP2 may be electrically connected to the source electrode SE of the first transistor T1. In some embodiments, the second conductive pattern CP2 and the source electrode SE may be integrally formed. The second conductive pattern CP2 may be electrically connected to the first alignment electrode ALE1 of the display element layer DPL through the second opening OPN2 in the passivation layer PSV and the second via hole VIH2 in the via layer VIA.

The third conductive pattern CP3 may be the first power wire PL1 to which the voltage of the first driving power source VDD is applied. The third conductive pattern CP3 may be electrically connected to the floating pattern FTP of the display element layer DPL through the third opening OPN3 in the passivation layer PSV and the third via hole VIH3 in the via layer VIA.

The first, second, and third conductive patterns CP1, CP2, and CP3 may be formed as a double layer stacked in the order of titanium (Ti) and copper (Cu).

The via layer VIA may be disposed on the first, second, and third conductive patterns CP1, CP2, and CP3.

A profile of the via layer VIA may prevent (e.g., may be formed to prevent) an electrode pattern disposed thereon, for example, the alignment electrodes ALE from being cut (or disconnected). For example, the via layer VIA may include a stepped area according to the position of the via hole VIH. The via layer VIA may include a stepped structure having a different thickness (or height) for each area. The via layer VIA having the different thickness (or height) for each area may be formed by using a halftone mask or the like.

The via layer VIA may include a first area VIA_a having a first thickness d1 and a second area VIA_b having a second thickness d2 smaller than (or thinner than) the first thickness d1. The thickness of the via layer VIA may be measured from a reference surface, such as one surface of the substrate SUB. The via layer VIA may have a flat surface in each area irrespective of shapes of components disposed thereunder.

The second area VIA_b may be positioned in the pixel area PXA and directly adjacent to the corresponding via hole VIH. The second area VIA_b may be positioned in the pixel area PXA and directly adjacent to each of the first to third via holes VIH1, VIH2, and VIH3. Each of the first to third via holes VIH1, VIH2, and VIH3 may be positioned on the conductive patterns being configured as a double layer stacked in the order of titanium (Ti) and copper (Cu) and having a substantially thick thickness, for example, a thickness of about 6000 Å. Each of the first to third via holes VIH1, VIH2, and VIH3 may expose one area of the conductive patterns. The first via hole VIH1 is positioned over the first conductive pattern CP1 to expose one area of the first conductive pattern CP1, the second via hole VIH2 is positioned over the second conductive pattern CP2 to expose one area of the second conductive pattern CP2, and the third via hole VIH3 is positioned over the third conductive pattern CP3 to expose one area of the third conductive pattern CP3. The second area VIA_b may be positioned directly adjacent to each of the first, second, and third via holes VIH1, VIH2, and VIH3 and may overlap a portion of the first conductive pattern CP1, a portion of the second conductive pattern CP2, and a portion of the third conductive pattern CP3.

When viewed in a plan view, the second area VIA_b may have a ring shape entirely surrounding (e.g., entirely surrounding in a plan view or extending entirely around a periphery of) the corresponding via hole VIH. For example, the second area VIA_b may have a ring shape entirely surrounding the first via hole VIH1 exposing one area of the first conductive pattern CP1 as shown in FIG. 14C. In addition, the second area VIA_b may have a ring shape entirely surrounding the second via hole VIH2 exposing one area of the second conductive pattern CP2 as shown in FIG.

13B. The second area VIA_b may have a ring shape entirely surrounding the third via hole VIH3 exposing one area of the third conductive pattern CP3.

The second area VIA_b may be positioned in the pixel area PXA to be directly adjacent to the corresponding via hole VIH. The second area VIA_b may be positioned in the pixel area PXA to be directly adjacent to each of the first to third via holes VIH1, VIH2, and VIH3. Each of the first to third via holes VIH1, VIH2, and VIH3 may be configured as a double layer stacked in the order of titanium (Ti) and copper (Cu), and may be positioned on the upper portion of the conductive patterns having a substantially thick thickness, for example, a thickness of about 6000 Å to expose one area of the conductive patterns. The first via hole VIH1 is positioned on the first conductive pattern CP1 to expose one area of the first conductive pattern CP1, the second via hole VIH2 is positioned on the second conductive pattern CP2 to expose one area of the second conductive pattern CP2, and the third via hole VIH3 is positioned on the third conductive pattern CP3 to expose one area of the third conductive pattern CP3. The second area VIA_b may be positioned directly adjacent to each of the first, second, and third via holes VIH1, VIH2, and VIH3, and may overlap a portion of the first conductive pattern CP1, a portion of the second conductive pattern CP2, and a portion of the third conductive pattern CP3.

When viewed in a plan view, the second area VIA_b may have a ring shape entirely surrounding the corresponding via hole VIH. For example, the second area VIA_b may have a ring shape entirely surrounding the first via hole VIH1 exposing one area of the first conductive pattern CP1 as shown in FIG. 14C. In addition, the second area VIA_b may have a ring shape entirely surrounding the second via hole VIH2 exposing one area of the second conductive pattern CP2 as shown in FIG. 13B. The second area VIA_b may have a ring shape entirely surrounding the third via hole VIH3 exposing one area of the third conductive pattern CP3.

The second area VIA_b may have an inclined surface having a straight line portion on one surface contacting the corresponding via hole VIH. For example, the second area VIA_b surrounding the first via hole VIH1 may have an inclined surface having a straight line portion on one surface contacting the first via hole VIH1, the second area VIA_b surrounding the second via hole VIH2 may have an inclined surface including a straight line on one surface contacting the second via hole VIH2, and the second area VIA_b surrounding the third via hole VIH3 may have an inclined surface including a straight line on one surface contacting (e.g., exposed to) the third via hole VIH3. The first area VIA_a surrounding the second area VIA_b may have an inclined surface having a straight line portion on one surface contacting (e.g., exposed to) the second area VIA_b.

However, the present disclosure is not limited to the above-described embodiment, and in some embodiments, the second area VIA_b surrounding each of the first, second, and third via holes VIH1, VIH2, and VIH3 may have an inclined surface having a curved line portion on one surface contacting the corresponding via hole VIH, and the first area VIA_a surrounding the second area VIA_b may have an inclined surface having a curved line portion on one surface contacting the second area VIA_b. For example, as shown in FIG. 14B, the second area VIA_b surrounding the first via hole VIH1 may have an inclined surface having a curved line portion on one surface contacting the first via hole VIH1, and the first area VIA_a surrounding the second area VIA_b may have an inclined surface having a curved line portion on one surface contacting the second area VIA_b.

In an embodiment, a first inclination angle (e.g., a first angle) $\theta 1$ of the second area VIA_b with respect to one surface of the second area VIA_b surrounding the second via hole VIH2 (or contacting or open to the second via hole VIH2) and the upper surface of the passivation layer PSV may be substantially the same as or similar to a second inclination angle (e.g., a second angle) $\theta 2$ of the second area VIA_b with respect to one surface of the second area VIA_b surrounding the first via hole VIH1 (or contacting or open to the first via hole VIH1) and the upper surface of the passivation layer PSV. However, the present disclosure is not limited thereto.

The first inclination angle $\theta 1$ and/or the second inclination angle $\theta 2$ may be substantially the same as or similar to a third inclination angle (e.g., a third angle) 63 of the second area VIA_b with respect to one surface of the second area VIA_b surrounding the third via hole VIH3 (or contacting or open to the third via hole VIH3) and the upper surface of the passivation layer PSV but are not limited thereto.

In an embodiment, a width of the second area VIA_b may be smaller than a width of the corresponding via hole VIH. For example, a width W4 of the second area VIA_b surrounding the first via hole VIH1 may be smaller than a width (or diameter) W3 of the first via hole VIH1, and a width W2 of the second area VIA_b surrounding the second via hole VIH2 may be smaller than a width (or diameter) W1 of the second via hole VIH2. For example, the width W3 of the first via hole VIH1 and the width W1 of the second via hole VIH2 may be in a range of about 3 μm to about 7 μm, respectively, but are not limited thereto.

The first area VIA_a may be positioned in the pixel area PXA to be directly adjacent to the second area VIA_b. At a boundary VIA_c between the first area VIA_a and the second area VIA_b, the via layer VIA may have a stepped structure. When viewed in a plan view, the first area VIA_a may entirely surround the circumference (or periphery) VIA_c of the second area VIA_b. The circumference VIA_c of the second area VIA_b may be a boundary between the first area VIA_a and the second area VIA_b.

Due to the first, second, and third via holes VIH1, VIH2, and VIH3, the second area VIA_b entirely surrounding the circumference of the corresponding via hole VIH and having the second thickness d2, and the first area VIA_a entirely surrounding the circumference of the second area VIA_b and having the first thickness d1 greater than (e.g., thicker than) the second thickness d2, the via layer VIA may have a stepped shape in the vicinity of the corresponding via hole VIH. For example, the via layer VIA may have a step shape due to the second area VIA_b surrounding the circumference of the first via hole VIH1 near the first via hole VIH1 and the first area VIA_a surrounding the circumference of the second area VIA_b near the first via hole VIH1. In addition, the via layer VIA may have a step shape due to the second area VIA_b surrounding the circumference of the second via hole VIH2 and the first area VIA_a surrounding the circumference of the second area VIA_b, near the second via hole VIH2. The via layer VIA may have a step shape due to the second area VIA_b surrounding the circumference of the third via hole VIH3 and the first area VIA_a surrounding the circumference of the second area VIA_b, near the third via hole VIH3.

As described above, due to the step shape, the profile of the via layer VIA may be smooth near the first, second, and third via holes VIH1, VIH2, and VIH3.

The display element layer DPL may be disposed on the via layer VIA.

The display element layer DPL may include bank patterns BNP, alignment electrodes ALE, a first bank BNK1, light emitting elements LD, electrodes PE, and/or intermediate electrodes CTE.

The bank patterns BNP may be positioned on the via layer VIA. As an example, the bank patterns BNP may protrude in the third direction DR3 on one surface of the via layer VIA. Accordingly, one area of the alignment electrodes ALE disposed on the bank patterns BNP may protrude in the third direction DR3 (e.g., the thickness direction of the substrate SUB).

The bank patterns BNP may include an inorganic insulating film including an inorganic material or an organic insulating film including an organic material. In some embodiments, the bank pattern BNP may include an organic insulating film of a single film and/or an inorganic insulating film of a single film, but it is not limited thereto. In some embodiments, the bank pattern BNP may be a multi-layered structure in which at least one or more of organic insulating film and at least one or more of inorganic insulating film are stacked. However, the material of the bank pattern BNP is not limited to the above-described examples, and in some embodiments, the bank pattern BNP may include a conductive material (or substance).

The bank pattern BNP may have a trapezoidal cross-sectional shape in which a width thereof narrows from a surface (e.g., an upper surface) of the via layer VIA toward an upper portion of the bank pattern BNP along the third direction DR3, but it is not limited thereto. In some embodiments, the bank pattern BNP may have a a semi-elliptic cross-sectional shape or a semi-circular shape (or semi-spherical shape) in which a width thereof narrows from one surface of the via layer VIA toward an upper portion of the bank pattern BNP along the third direction DR3. The cross-sectional shapes of the bank pattern BNP are not limited to the above-described embodiments, and the shapes thereof may be variously changed such that the first to fourth bank patterns may improve efficiency of light emitted from each of the light emitting elements LD. In addition, in some embodiments, at least one of the bank pattern BNP may be omitted, or the position thereof may be changed.

The bank pattern BNP may act as a reflective member. As an example, the bank pattern BNP may act as members that guide the light emitted from each light emitting element LD in an image display direction of the display device DD together with the alignment electrode ALE disposed thereon to improve the light output efficiency of the pixel PXL.

The alignment electrodes ALE may be positioned on the bank pattern BNP.

The alignment electrodes ALE may be disposed on the same plane and may have the same thickness in the third direction DR3. The alignment electrodes ALE may be concurrently (or simultaneously) formed in the same process.

The alignment electrodes ALE may be formed of a material having a reflectance (e.g., a reflective material) to allow light emitted from the light emitting elements LD to be directed in the image display direction (e.g., a front direction) of the display device DD. For example, the alignment electrodes ALE may be made of a conductive material (or substance). The conductive material may include an opaque metal configured to reflect light emitted by the light emitting elements LD in the image display direction of the display device DD. The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the material of the alignment electrodes ALE is not limited to the above-described materials. In some embodiments, the alignment electrodes ALE may also include a transparent conductive material (or substance). The transparent conductive material (or substance) may include a conductive oxide, such as an indium tin oxide (ITO), an indium zinc oxide (IZO), a zinc oxide (ZnOx), an indium gallium zinc oxide (IGZO), and an indium tin zinc oxide (ITZO), and a conductive polymer, such as poly(3,4-ethylenedioxythiophene (PEDOT)). When the alignment electrodes ALE include the transparent conductive material (or substance), a separate conductive layer made of an opaque metal may be added to reflect the light emitted from the light-emitting elements LD in the image display direction of the display device DD. However, the material of the alignment electrodes ALE is not limited to the above-described materials.

Each of the alignment electrodes ALE may be provided and/or formed as a single film, but they are not limited thereto. In some embodiments, each of the alignment electrodes ALE may be provided and/or formed as a multi-layered film in which at least two or more of metals, alloys, conductive oxides, and conductive polymers are stacked. Each of the alignment electrodes ALE may be formed as a multi-layer film (e.g., a multifilm) including at least a double film or more to reduce or minimize distortion due to signal delay when a signal (or voltage) is transmitted to respective end portions of each of the light emitting elements LD, for example, the first and second end portions EP1 and EP2. For example, each of the alignment electrodes ALE may be formed as a multifilm selectively further including at least one of at least one reflective electrode layer, at least one transparent electrode layer disposed above and/or below the reflective electrode layer, and at least one conductive capping layer covering upper portions of the reflective electrode layer and/or the transparent electrode layer.

As described above, when the alignment electrodes ALE are made of the reflective conductive material, the light emitted from both end portions of each of the light emitting elements LD, that is, from the first and second end portions EP1 and EP2, may proceed in (e.g., may be reflected to proceed in) the image display direction of the display device DD.

The first alignment electrode ALE1 may be electrically connected to the second conductive pattern CP2 (or the second storage electrode UE) of the pixel circuit layer PCL through the second via hole VIH2 in the via layer VIA and the second opening OPN2 in the passivation layer PSV. The second alignment electrode ALE2 may be electrically connected to the first conductive pattern CP1 (or the second power wire PL2) of the pixel circuit layer PCL through the first via hole VIH1 in the via layer VIA and the first opening OPN1 in the passivation layer PSV.

The first insulating layer INS1 may be provided and/or formed on the alignment electrodes ALE.

The first insulating layer INS1 may be disposed on the alignment electrodes ALE and the via layer VIA. The first insulating layer INS1 may be partially opened (e.g., may have an opening therein) to expose components positioned thereunder in at least the non-emission area NEA. For example, the first insulating layer INS1 may be partially opened to have the first contact hole CH1 exposing a portion of the first alignment electrode ALE1 by removing one area from at least the non-emission area NEA and the second contact hole CH2 exposing a portion of the second alignment electrode ALE2 by removing another area from the at least the non-emission area NEA.

The first insulating layer INS1 may be formed as an inorganic insulating film made of an inorganic material. For example, the first insulating layer INS1 may be formed as an inorganic insulating film configured to protect the light emitting elements LD from the pixel circuit layer PCL. For example, the first insulating layer INS1 may include at least one of a metal oxide, such as a silicon nitride ($SiN_x$), a silicon oxide ($SiO_x$), a silicon oxynitride ($SiO_xN_y$), and an aluminum oxide ($AlO_x$). The first insulating layer INS1 made of an inorganic insulating film may have a profile (e.g., a surface) corresponding to the profile of the components positioned thereunder. In such an embodiment, an empty gap (or a separation space) may exist between each of the light emitting elements LD and the first insulating layer INS1. In some embodiments, the first insulating layer INS1 may be formed as an organic insulating film made of an organic material.

The first insulating layer INS1 may be provided as a single film or multifilm. When the first insulating layer INS1 is provided as a multifilm, the first insulating layer INS1 may be provided as a distributed Bragg reflector (DBR) structure in which a first film and a second film having different refractive indexes are alternately stacked.

The first insulating layer INS1 may be entirely disposed in the emission area EMA and the non-emission area NEA of each pixel PXL but is not limited thereto. In some embodiments, the first insulating layer INS1 may be positioned in only a specific area of each pixel PXL, for example, in the emission area EMA.

The first bank BNK1 may be positioned on the first insulating layer INS1.

The first bank BNK1 may be disposed on the first insulating layer INS1 in at least the non-emission area NEA but is not limited thereto.

The above-described first bank BNK1 and bank pattern BNP may be formed by different processes to be provided on different layers but are not limited thereto. In some embodiments, the first bank BNK1 and the bank pattern BNP may be formed by different processes and provided on the same layer or may be formed by the same process and provided on the same layer.

In the emission area EMA of the pixel PXL in which the first insulating layer INS1 and the first bank BNK1 are formed, the light emitting elements LD may be supplied and aligned. For example, the light emitting elements LD are supplied (or inputted) to the emission area EMA through an inkjet printing method or the like, and the light emitting elements LD may be aligned between the alignment electrodes ALE by an electric field formed by a signal (e.g., an alignment signal or a predetermined signal) applied to each of the alignment electrodes ALE. As an example, the light emitting elements LD may be aligned on the first insulating layer INS1 between the first alignment electrode ALE1 and the second alignment electrode ALE2.

The light emitting elements LD may include the first light emitting element LD1 and the second light emitting element LD2.

The first light emitting element LD1 may be arranged between the right side of the first alignment electrode ALE1 and another second alignment electrode ALE2 adjacent to the right side of the first alignment electrode ALE1. The first light emitting element LD1 may have the first end portion EP1 overlapping the first alignment electrode ALE1 and the second end portion EP2 overlapping the another (or the other) second alignment electrode ALE2.

The second light emitting element LD2 may be arranged between the left side of the first alignment electrode ALE1 and the second alignment electrode ALE2 adjacent to the left side of the first alignment electrode ALE1. The second light emitting element LD2 may have the first end portion EP1 overlapping the left side of the first alignment electrode ALE1 and the second end portion EP2 overlapping the second alignment electrode ALE2.

A second insulating layer INS2 (or an insulating pattern) may be disposed on the first and second light emitting elements LD1 and LD2, respectively. The second insulating layer INS2 may be positioned on the first and second light emitting elements LD1 and LD2 to partially cover an outer circumferential surface (e.g., a surface) of each of the first and second light emitting elements LD1 and LD2 while exposing the first end portion EP1 and the second end portion EP2 of each of the first and second light emitting devices LD1 and LD2 to the outside.

The second insulating layer INS2 may include an inorganic insulating film including an inorganic material or an organic insulating film. For example, the second insulating layer INS2 may include an inorganic insulating film configured to protect the active layers 12 of each of the first and second light emitting elements LD1 and LD2 from external oxygen and moisture. However, the present disclosure is not limited thereto, and the second insulating layer INS2 may be configured as an organic insulating film including an organic material according to the design condition of the display device DD (or the display panel DP) to which the first and second light emitting elements LD1 and LD2 are to be applied. The second insulating layer INS2 may be configured as a single film or multifilm.

When an empty gap exists between the first and second light emitting elements LD1 and LD2 and the first insulating layer INS1 before the second insulating layer INS2 is formed, the empty gap may be filled with the second insulating layer INS2 in the process of forming the second insulating layer INS2.

By forming the second insulating layer INS2 on the aligned light emitting elements LD in the emission area EMA of each pixel PXL, the light emitting elements LD may not deviate (e.g., may not move or separate) from their aligned position.

On the first and second end portions EP1 and EP2 of the light emitting elements LD not covered by (e.g., exposed by) the second insulating layer INS2, different electrodes from among the first electrode PE1, the second electrode PE2, and the intermediate electrode CTE may be formed. For example, the first electrode PE1 may be formed on the first end EP1 portion of the first light emitting element LD1, the intermediate electrode CTE may be formed on the second end portion EP2 of the first light emitting element LD1, the intermediate electrode CTE may be formed on the first end portion EP1 of the second light emitting element LD2, and the second electrode PE2 may be formed on the second end portion EP2 of the second light emitting element LD2.

The first electrode PE1 may be disposed at the upper portion of the first alignment electrode ALE1 to overlap the right side of the first alignment electrode ALE1, and the second electrode PE2 may be disposed at the upper portion of the second alignment electrode ALE2 to overlap the second alignment electrode ALE2 adjacent to the left side of the first alignment electrode ALE1. The intermediate electrode CTE may be disposed at the upper portion of each of the other second alignment electrodes ALE2 adjacent to the left side of the first alignment electrode ALE1 and the right side of the first alignment electrode ALE1.

The first electrode PE1 may be electrically connected to the first alignment electrode ALE1 through the first contact hole CH1 in the first insulating layer INS1, and the second electrode PE2 may be electrically connected to the second alignment electrode ALE2 through the second contact hole CH2 in the first insulating layer INS1.

In different embodiments, the first electrode PE1, the intermediate electrode CTE, and the second electrode PE2 may be formed on the same layer or different layers. For example, the mutual positions and/or the formation order of the first electrode PE1, the intermediate electrode CTE, and the second electrode PE2 may be variously changed.

In the embodiment shown in FIG. 7, the intermediate electrode CTE may be first formed on the second insulating layer INS2. The intermediate electrode CTE may be electrically connected between the first light emitting element LD1 and the second light emitting element LD2 by directly contacting the second end portion EP2 of the first light emitting element LD1 and the first end portion EP1 of the second light emitting element LD2. Thereafter, the third insulating layer INS3 may be formed in the emission area EMA to cover the intermediate electrode CTE.

The third insulating layer INS3 may be positioned on the intermediate electrode CTE to cover the intermediate electrode CTE (or to not expose the intermediate electrode CTE to the outside) to protect the intermediate electrode CTE.

The third insulating layer INS3 may include an inorganic insulating film made of an inorganic material or an organic insulating film made of an organic material. For example, the third insulating layer INS3 may include at least one of a metal oxide, such as a silicon nitride ($SiN_x$), a silicon oxide ($SiO_x$), a silicon oxynitride ($SiO_xN_y$), and an aluminum oxide ($AlO_x$), but is not limited thereto. In addition, the third insulating layer INS3 may be formed as a single layer or a multilayer.

The first electrode PE1 and the second electrode PE2 may be formed on the third insulating layer INS3. The first electrode PE1 may directly contact the first end portion EP1 of the first light emitting element LD1. The second electrode PE2 may directly contact the second end portion EP2 of the second light emitting element LD2.

In the embodiment shown in FIG. 8, the first and second electrodes PE1 and PE2 may be formed on the second insulating layer INS2. The first and second electrodes PE1 and PE2 may be formed concurrently (or simultaneously) or continuously. Thereafter, the third insulating layer INS3 may be formed to cover the first and second electrodes PE1 and PE2, and the intermediate electrode CTE may be formed in the emission area EMA in which the third insulating layer INS3 is formed.

As in the embodiments shown in FIGS. 7 and 8, when the electrodes disposed on the first end portion EP1 and the second end portion EP2 of each light emitting element LD are disposed on different layers, because the electrodes may be stably separated from each other, electrical stability (e.g., electrical insulation) between the first and second end portions EP1 and EP2 of the light emitting elements LD may be secured.

In the embodiment shown in FIG. 9, the first electrode PE1, the intermediate electrode CTE, and the second electrode PE2 may be disposed on the same layer of the display element layer DPL and may be formed concurrently (or simultaneously) or sequentially. The third insulating layer INS3 may be omitted. In the embodiment shown in FIG. 9, when the electrodes disposed on the first end portion EP1 and the second end portion EP2 of each light emitting element LD are disposed on the same layer and concurrently (or simultaneously) formed, the manufacturing process of the pixel PXL may be simplified and process efficiency thereof may be improved.

Each of the first electrode PE1, the second electrode PE2, and the intermediate electrode CTE may be made of various transparent conductive materials. For example, each of the first electrode PE1, the second electrode PE2, and the intermediate electrode CTE may include at least one of various transparent conductive materials including an indium tin oxide (ITO), an indium zinc oxide (IZO), an indium tin zinc oxide (ITZO), an aluminum zinc oxide (AZO), a gallium zinc oxide (GZO), a zinc tin oxide (ZTO), and a gallium tin oxide (GTO), and may be formed to be substantially transparent or translucent to provide a light transmittance (e.g., a predetermined light transmittance). Accordingly, the light emitted from the first and second end portions EP1 and EP2 of the light emitting elements LD may pass through the electrodes PE and the intermediate electrode CTE to be emitted to the outside of the display device DD (or the display panel DP).

In some embodiments, at least one overcoat layer (e.g., a layer for planarizing the upper surface of the display element layer DPL) may be further disposed on the first electrode PE1, the intermediate electrode CTE, and the second electrode PE2.

According to another embodiment, the optical layer LCL may be selectively disposed on the display element layer DPL of each pixel PXL, as shown in, for example, FIGS. 10 and 11. For example, the optical layer LCL may include the color converting layer CCL and the color filter CF.

In the embodiment shown in FIG. 10, the optical layer LCL may include a first color filter CF1 and the color converting layer CCL positioned in the emission area EMA and a second bank BNK2 positioned in the non-emission area NEA.

The second bank BNK2 may be provided and/or formed on the first bank BNK1 in the non-emission area NEA. The second bank BNK2 surrounds (e.g., surrounds in a plan view or extends around a periphery of) the emission area EMA of the pixel PXL and may be a dam structure that defines the emission area EMA by defining a position to which the color converting layer CCL is to be supplied (or formed).

The second bank BNK2 may include a light blocking material. For example, the second bank BNK2 may be a black matrix. In some embodiments, the second bank BNK2 may include at least one light blocking material and/or reflective material so that light emitted from the color converting layer CCL proceeds in the image display direction of the display device DD, thereby improving light output efficiency of the color converting layer CCL.

The color converting layer CCL may be formed on (e.g., at the upper portion of) the first electrode PE1, the intermediate electrode CTE, and the second electrode PE2 of each pixel PXL in the emission area EMA surrounded by the second bank BNK2.

The color converting layer CCL may include color converting particles QD corresponding to a specific color. For example, the color converting layer CCL may include color converting particles QD configured to convert light of a first color emitted from the light emitting elements LD into light of a second color (or a specific color) having a different color from the light of the first color.

When the pixel PXL is a red pixel (e.g., a red sub-pixel), the color converting layer CCL of the pixel PXL may include the color converting particles QD of red quantum dots that convert the light of the first color emitted from the light emitting elements LD into the light of the second color (e.g., light of a red color).

When the pixel PXL is a green pixel (e.g., a green sub-pixel), the color converting layer CCL of the pixel PXL may include the color converting particles QD of green quantum dots that convert the light of the first color emitted from the light emitting elements LD into the light of the second color (e.g., light of a green color).

When the pixel PXL is a blue pixel (e.g., a blue sub-pixel), the color converting layer CCL of the pixel PXL may include the color converting particles QD of blue quantum dots that convert the light of the first color emitted from the light emitting elements LD into the light of the second color (e.g., light of a blue color). When the pixel PXL is a blue pixel (e.g., a blue sub-pixel), in some embodiments, a light scattering layer including light scattering particles SCT may be provided instead of the color converting layer CCL including the color converting particles QD. For example, when the light emitting elements LD emits blue light, the pixel PXL may include the light scattering layer including the light scattering particles SCT. The above-described light scattering layer may be omitted in some embodiments. According to another embodiment, when the pixel PXL is the blue pixel (e.g., the blue sub-pixel), a transparent polymer may be provided instead of the color converting layer CCL.

A fourth insulating layer INS4 may be disposed on the color converting layer CCL positioned in the emission area EMA and on the second bank BNK2 positioned in the non-emission area NEA.

The fourth insulating layer INS4 may be entirely provided in the display area DA (or the pixel area PXA) in which the pixel PXL is positioned to cover the second bank BNK2 and the color converting layer CCL. The fourth insulating layer INS4 may be directly disposed on the second bank BNK2 and the color converting layer CCL.

The fourth insulating layer INS4 may be an inorganic insulating film including an inorganic material. The fourth insulating layer INS4 may include at least one of a metal oxide, such as a silicon nitride ($SiN_x$), a silicon oxide ($SiO_x$), a silicon oxynitride ($SiO_xN_y$), and an aluminum oxide ($AlO_x$). The fourth insulating layer INS4 may entirely cover the second bank BNK2 and the color converting layer CCL to prevent moisture or the like from flowing into the display element layer DPL from the outside.

The fourth insulating layer INS4 may have a flat surface while alleviating a step caused by components disposed thereunder. For example, the fourth insulating layer INS4 may include an organic insulating film including an organic material. The fourth insulating layer INS4 may be a common layer commonly provided to the display area DA, but it is not limited thereto.

A color filter layer CFL may be provided and/or formed on the fourth insulating layer INS4. The color filter layer CFL may include a color filter CF corresponding to each pixel PXL. For example, the color filter layer CFL may include a first color filter CF1 disposed on the color converting layer CCL of one pixel PXL (hereinafter referred to as a "first pixel"), a second color filter CF2 disposed on the color converting layer of a pixel (hereinafter referred to as a "second pixel") adjacent to the first pixel PXL, and a third color filter CF3 disposed on the color converting layer of a pixel (hereinafter referred to as a "third pixel") adjacent to the second pixel.

The first, second, and third color filters CF1, CF2, and CF3 may be disposed to overlap each other in the non-emission area NEA to act as a light blocking member to block light interference between adjacent pixels. Each of the first, second, and third color filters CF1, CF2, and CF3 may include a color filter material that selectively transmits the light of the second color converted by a corresponding color converting layer. For example, the first color filter CF1 may be a red color filter, the second color filter CF2 may be a green color filter, and the third color filter CF3 may be a blue color filter, but they are not limited thereto.

An encapsulation layer ENC may be provided and/or formed on the color filter layer CFL.

The encapsulation layer ENC may include a fifth insulating layer INS5. The fifth insulating layer INS5 may be an inorganic insulating film including an inorganic material or an organic insulating film including an organic material. The fifth insulating layer INS5 may entirely cover components positioned thereunder to block moisture or the like from flowing into the color filter layer CFL and the display element layer DPL from the outside.

The fifth insulating layer INS5 may be formed as a multilayer. For example, the fifth insulating layer INS5 may include at least two inorganic insulating films and at least one organic insulating film interposed between the at least two inorganic insulating films. However, the material and/or structure of the fifth insulating layer INS5 may be variously changed. In addition, in some embodiments, at least one overcoat layer, filler layer, and/or upper substrate may be further disposed on the fifth insulating layer INS5.

In the pixel PXL according to the above-described embodiment, the color converting layer CCL and the color filter layer CFL are disposed on the light emitting element LD through a continuous process so that light output efficiency may be improved by emitting light having excellent color reproducibility through the color converting layer CCL and the color filter layer CFL.

In some embodiments, the optical layer LCL including color converting layer CCL and the color filter layer CFL may be formed by a continuous process on one surface of the base layer BSL as shown in, for example, FIG. 11 to form a separate substrate, for example, an upper substrate U_SUB. The upper substrate U_SUB may be combined with (e.g., coupled to) the display element layer DPL through the intermediate layer CTL or the like.

The intermediate layer CTL may be a transparent adhesive layer (or bonding layer) for reinforcing adherence between the display element layer DPL and the upper substrate U_SUB, for example, an optically clear adhesive layer, but it is not limited thereto. In some embodiments, the intermediate layer CTL may be a refractive index converting layer for improving light emitting luminance of the pixel PXL by converting refractive index of light emitted from the light emitting elements LD and proceeding to the upper substrate U_SUB. In some embodiments, the intermediate layer CTL may include a filler made of an insulating material having insulating properties and adhesive properties.

The upper substrate U_SUB may include a base layer BSL, a color filter layer CFL, a first capping layer CPL1, a second bank BNK2, a color converting layer CCL, and a second capping layer CPL2.

The base layer BSL may be a rigid substrate or a flexible substrate, and its material or physical properties are not particularly limited. The base layer BSL may be made of the same material as the substrate SUB or may be made of a material different from the substrate SUB.

The color filter layer CFL and the color converting layer CCL may be disposed on one surface of the base layer BSL to face the display element layer DPL. The first color filter CF1 of the color filter layer CFL may be provided on one surface of the base layer BSL to correspond to the color converting layer CCL in the emission area EMA. The first, second, and third color filters CF1, CF2, and CF3 of the color filter layer CFL may be disposed to overlap each other in the non-emission area NEA to act as a light blocking member.

The first capping layer CPL1 may be disposed between the color filter layer CFL and the color converting layer CCL.

The first capping layer CPL1 may be positioned on the color filter layer CFL to cover the color filter layer CFL, thereby protecting the color filter layer CFL. The first capping layer CPL1 may be an inorganic film including an inorganic material or an organic film including an organic material.

The second bank BNK2 and the color converting layer CCL may be positioned on one surface of the first capping layer CPL1.

The second bank BNK2 may be a dam structure that defines the emission area EMA of the pixel PXL.

The second capping layer CPL2 may be entirely disposed on the second bank BNK2 and the color converting layer CCL.

The second capping layer CPL2 may include at least one of a metal oxide, such as a silicon nitride ($SiN_x$), a silicon oxide ($SiO_x$), a silicon oxynitride ($SiO_xN_y$), and an aluminum oxide ($AlO_x$), but is not limited thereto. In some embodiments, the second capping layer CPL2 may be configured as an organic film including an organic material. The second capping layer CPL2 is positioned on the color converting layer CCL to protect the color converting layer CCL from external moisture or the like, thereby further improving reliability of the color converting layer CCL.

The above-described upper substrate U_SUB may be combined with the display element layer DPL by using the intermediate layer CTL.

According to the above-described embodiments, the via layer VIA may have a stepped shape near the corresponding via hole VIH because the second area VIA_b surrounding the circumference of the corresponding via hole VIH (e.g., the first, second, and third via holes VIH1, VIH2, and VIH3) has the second thickness d2 and the first area VIA_a surrounding the circumference of the second area VIA_b has the first thickness d1 greater than (or thicker) than the second thickness d2. For example, the via layer VIA may have a stepped structure in the vicinity of each of the first, second, and third via holes VIH1, VIH2, and VIH3. Due to the stepped structure, the via layer VIA may have a gentle profile near the first, second, and third via holes VIH1, VIH2, and VIH3. Accordingly, step coverage may be improved in a subsequent process performed after the via layer VIA is formed. For example, in the electrode pattern positioned on the via layer VIA, for example, the first and second alignment electrodes ALE1 and ALE2, a thickness of a wire thereof may not be reduced or the wire may not broken in the first, second, and third via holes VIH1, VIH2, and VIH3 due to the gentle profile of the via layer VIA. Accordingly, a disconnection defect of the first and second alignment electrodes ALE1 and ALE2 may be prevented, and thus, the reliability of the pixel PXL and the display device DD including the same may be improved.

Hereinafter, a manufacturing method of the above-described via layer VIA will be described with reference to FIGS. 16A to 16C.

FIGS. 16A to 16C illustrate schematic cross-sectional views of steps of a manufacturing method of the via layer VIA and the passivation layer PSV shown in FIG. 12.

Referring to FIG. 12 and FIG. 16A, an insulating material layer VIA' configured as an organic film is entirely coated on the passivation layer PSV. The insulating material layer VIA' may be a base material of the via layer VIA.

Referring to FIG. 12, FIG. 15, FIG. 16A, and FIG. 16B, a photosensitive material may be coated on the insulating material layer VIA', and a photolithography process using a halftone mask may be performed thereon to form the via layer VIA having a stepped structure having a different thickness for each area.

The via layer VIA may have the first, second, and third via holes VIH1, VIH2, and VIH3 exposing the upper surface of the passivation layer PSV, the second area VIA_b having the second thickness d2, and the first area VIA_a having the first thickness d1 that is greater (or thicker) than the second thickness d2.

Referring to FIG. 12, FIG. 15, and FIG. 16A to FIG. 16C, a dry etching process using the via layer VIA as an etch mask is performed so that the passivation layer PSV, at where the upper surface is exposed by the first, second, and third via holes VIH1, VIH2, and VIH3, may be partially opened to expose one area of each of the conductive patterns positioned under the passivation layer PVS, for example, the first, second, and third conductive patterns CP1, CP2, and CP3.

Due to the dry etching process described above, the passivation layer PSV may have the first opening OPN1 corresponding to the first via hole VIH1 of the via layer VIA, the second opening OPN2 corresponding to the second via hole VIH2 of the via layer VIA, and the third opening OPN3 corresponding to the third via hole VIH3 of the via layer VIA.

FIG. 17 illustrates a schematic cross-sectional view taken along the line I-I' of FIG. 3.

Referring to FIGS. 1 to 17, each of the pads PD positioned in the non-display area NDA may include a first pad electrode PDE1 and a second pad electrode PDE2.

The first pad electrode PDE1 may be positioned on the interlayer insulating layer ILD. The first pad electrode PDE1 may be provided on the same layer as the first, second, and third conductive patterns CP1, CP2, and CP3. For example, the first pad electrode PDE1 may be formed in the same process as the first, second, and third conductive patterns CP1, CP2, and CP3 and positioned on the same layer. In an embodiment, the first pad electrode PDE1 may be configured as a double layer stacked in the order of titanium (Ti) and copper (Cu).

The passivation layer PSV may be disposed on the first pad electrode PDE1.

The passivation layer PSV may be partially opened to expose a portion of the first pad electrode PDE1 in the pad area PDA. For example, the passivation layer PVS may be partially opened to include a first pad electrode contact hole (e.g., a first pad electrode contact opening) PD_CH1 exposing a portion of the first pad electrode PDE1 in the at least pad area PDA.

The first insulating layer INS1 may be disposed on the passivation layer PSV.

The first insulating layer INS1 may be partially opened to include a second pad electrode contact hole (e.g., a second pad electrode contact opening) PD_CH2 corresponding to the first pad electrode contact hole PD_CH1. The second pad electrode PDE2 may be disposed on the first insulating layer INS1.

The second pad electrode PDE2 may be positioned on the first insulating layer INS1 to directly contact the first pad electrode PDE1 exposed by the first and second pad electrode contact holes PD_CH1 and PD_CH2 to be electrically connected to the first pad electrode PDE1. The second pad electrode PDE2 may be provided on the same layer as the intermediate electrode CTE. For example, the second pad electrode PDE2 may be formed in the same process as the intermediate electrode CTE and positioned on the same layer. The via layer VIA may not be disposed (or may be omitted) between the first pad electrode PDE1 and the second pad electrode PDE2. For example, the via layer VIA may not be disposed in the pad area PDA.

The second pad electrode PDE2 may be made of a transparent conductive oxide. The second pad electrode PDE2 may be exposed to the outside to be electrically connected to a driver by using a conductive adhesive member or the like.

In the above-described embodiments, by directly contacting the first pad electrode PDE1 including a stacked arrangement of titanium (Ti) and copper (Cu) and exposed by the first and second pad electrode contact holes PD_CH1 and PD_CH2, and the second pad electrode PDE2 made of a transparent conductive oxide as a second pad electrode, it is possible to block the first pad electrode PDE1 from directly contacting any conductive layer made of aluminum.

FIG. 18 schematically illustrates the pixel PXL according to an embodiment and illustrates a schematic cross-sectional view taken along the line III-III' of FIG. 6, FIG. 19A illustrates a schematic enlarged view of the area EA3 of FIG. 18, and FIG. 19B and FIG. 19C illustrate schematic drawings of a first conductive pattern and a via layer shown in FIG. 19A viewed from above.

In FIGS. 18 to 19C, differences from the above-described embodiments will be primarily described to avoid duplicate descriptions. In addition, in FIGS. 18 to 19C, constituent elements not specifically described and having the same reference numeral as a previously-described element are the same or substantially the same as in the embodiments described above.

In FIG. 19B and FIG. 19C, for better comprehension and ease of description, a pattern for identifying a second area VIA_b of the via layer VIA is applied.

Referring to FIG. 1 to FIG. 6 and FIG. 18 to FIG. 19C, the via layer VIA may have a first area VIA_a, a second area VIA_b, a first via hole VIH1, a second via hole VIH2, and a third via hole VIH3.

The via layer VIA may be positioned in the pixel area PXA to be directly adjacent to the corresponding via hole VIH. For example, the second area VIA_b may be positioned in the pixel area PXA to be directly adjacent to at least one side of each of the first and second via holes VIH1 and VIH2.

When viewed in a plan view, the second area VIA_b may surround (e.g., may extend around) at least one side of the corresponding via hole VIH. For example, the second area VIA_b may surround at least one side (e.g., a left side) of the first via hole VIH1 exposing one area of the first conductive pattern CP1 as shown in FIG. 19B. A width W6 of the second area VIA_b may be smaller than a width (or diameter) W5 of the first via hole VIH1. For example, when the width W5 of the first via hole VIH1 is about 7 μm, the width W6 of the second area VIA_b may be about 2 μm. However, the present disclosure is not limited thereto. In some embodiments, the second area VIA_b may surround the left side, the upper side, and the lower side of the first via hole VIH1 as shown in FIG. 19C.

When the second area VIA_b surrounds at least one side of the first via hole VIH1, the first area VIA_a may surround the second area VIA_b and the remaining area of the first via hole VIH1. For example, the first area VIA_a may surround the second area VIA_b, and the remaining area of the opened first via hole VIH1 may not be surrounded by the second area VIA_b. In such an embodiment, the first area VIA_a and the second area VIA_b may face each other with the first via hole VIH1 interposed therebetween when viewed from a cross-section. The second area VIA_b and the first area VIA_a facing each other with the first via hole VIH1 interposed therebetween may have different inclination angles. For example, as shown in FIG. 19A, an inclination angle θ4 of the second area VIA_b with respect to one side surface of the second area VIA_b in contact with the left side of the first via hole VIH1 (or surrounding the left side of the first via hole VIH1) and the upper surface of the passivation layer PSV may be smaller than an inclination angle θ5 of the first area VIA_a with respect to one side surface of the first area VIA_a in contact with the right side of the first via hole VIH1 (or surrounding the right side of the first via hole VIH1) and the upper surface of the passivation layer PSV.

The via layer VIA positioned near the left side of the first via hole VIH1 may have a step shape (or a smooth step structure) due to the first via hole VIH1, the second area VIA_b surrounding the left side of the first via hole VIH1, and the first area VIA_a surrounding the second area VIA_b. The via layer VIA positioned near the right side of the first via hole VIH1 may have a steep step structure due to the first via hole VIH1 and the first area VIA_a surrounding the first via hole VIH1.

Even when the via layer VIA positioned near the right side of the first via hole VIH1 has the steep step structure, because the via layer VIA positioned near the left side of the first via hole VIH1 has the step shape, the profile of the via layer VIA may be gentle in the vicinity of the left side of the first via hole VIH1. Accordingly, the thickness of the second alignment electrode ALE2 positioned on the via layer VIA may not become thin or the wire may not be broken in the first via hole VIH1 due to the gentle profile of the via layer VIA.

While the present disclosure has been shown and described with reference to embodiments thereof, it will be understood by those skilled in the art that various changes in forms and details may be made therein without departing from the technical scope of the present disclosure as defined by the appended claims and their equivalents.

Therefore, the embodiments disclosed in this specification are for illustrative purposes rather than to limit the technical scope of the present disclosure. The scope of the present disclosure is defined by the accompanying claims and their equivalents.

What is claimed is:

1. A pixel comprising:
a substrate having an emission area and a non-emission area;
a first conductive pattern, a second conductive pattern, and a third conductive pattern on the substrate and spaced apart from each other;
a passivation layer on the first, second, and third conductive patterns and exposing each of the first, second, and third conductive patterns;
a via layer on the passivation layer such that the passivation layer is between the via layer and the first, second, and third conductive patterns, the via layer having a first via hole exposing one area of the first conductive pattern, a second via hole exposing one area of the second conductive pattern, and a third via hole exposing one area of the third conductive pattern, the via layer having a first area having a first thickness and a second area having a second thickness smaller than the first thickness, the second area being directly adjacent to at least one of the first, second, and third via holes such that the at least one of the first, second, and third via holes has a stepped structure;
a second alignment electrode on the via layer and electrically connected to the first conductive pattern;
a first alignment electrode on the via layer and electrically connected to the second conductive pattern; and
a light emitting element on the first and second alignment electrodes.

2. The pixel of claim 1, wherein each of the first and second via holes has a first width, and
wherein the second area of the via layer has a second width that is smaller than the first width.

3. The pixel of claim 1, wherein the second area of the via layer overlaps the first, second, and third conductive patterns.

4. The pixel of claim 1, wherein the second area of the via layer extends entirely around each of the first and second via holes.

5. The pixel of claim 4, wherein the second area of the via layer has a ring shape around each of the first and second via holes in a plan view.

6. The pixel of claim 5, wherein the first area of the via layer extends around the second area of the via layer in the plan view.

7. The pixel of claim 1, wherein the second area of the via layer extends around at least one side of each of the first and second via holes.

8. The pixel of claim 7, wherein the second area of the via layer is directly adjacent to the at least one side of each of the first and second via holes.

9. The pixel of claim 8, wherein the second area of the via layer faces the first area of the via layer with each of the first and second via holes therebetween, and
wherein the second area of the via layer and the first area of the via layer facing each other with the first and second via holes therebetween have different inclination angles.

10. The pixel of claim 9, wherein, from among the second area of the via layer and the first area of the via layer facing each other with the first and second via holes therebetween, an inclination angle of the first area of the via layer is greater than an inclination angle of the second area of the via layer.

11. The pixel of claim 10, wherein the second area of the via layer extends around at least one side of each of the first and second via holes in a plan view, and
wherein the first area of the via layer extends around the second area of the via layer and the remainder of each of the first and second via holes in the plan view.

12. The pixel of claim 1, further comprising:
a transistor between the substrate and the passivation layer and electrically connected to the light emitting element;
a capacitor between the substrate and the passivation layer and comprising a first storage electrode connected to a gate electrode of the transistor and a second storage electrode electrically connected to the light emitting element;
a first power wire configured to receive a voltage of a first driving power source; and a second power wire spaced apart from the first power wire and configured to receive a voltage of a second driving power source different from the first driving power source.

13. The pixel of claim 12, wherein the first conductive pattern comprises the second power wire, wherein the second conductive pattern comprises the second storage electrode, and wherein the third conductive pattern comprises the first power wire.

14. The pixel of claim 13, further comprising:

a first insulating layer between the first and second alignment electrodes and the light emitting element;

a first bank in the non-emission area and having an opening corresponding to the emission area;

a second insulating layer on the light emitting element and exposing a first end portion and a second end portion of the light emitting element;

a first electrode electrically connected to the first end portion of the light emitting element; and a second electrode spaced apart from the first electrode and electrically connected to the second end portion of the light emitting element.

15. The pixel of claim 14, further comprising an intermediate electrode spaced apart from the first and second electrodes, wherein the light emitting element comprises:

a first light emitting element between one side of the first alignment electrode and the second alignment electrode and having a first end portion electrically connected to the first electrode and a second end portion electrically connected to the intermediate electrode; and a second light emitting element between another side of the first alignment electrode and the second alignment electrode and having a first end portion electrically connected to the intermediate electrode and a second end portion electrically connected to the second electrode.

16. The pixel of claim 15, further comprising:

a second bank on the first bank in the non-emission area;

a color converting layer on the first and second light emitting elements in the emission area and configured to convert light of a first color emitted from the first and second light emitting elements into light of a second color; and a color filter on the color converting layer and configured to selectively transmit the light of the second color.

17. A display device comprising:

a substrate having a display area and a non-display area, the non-display area comprising a pad area;

a plurality of pixels in the display area, each of the plurality of pixel having an emission area and a non-emission area; and a pad in the pad area and electrically connected to each of the pixels, wherein each of the plurality of pixels comprises:

a first conductive pattern, a second conductive pattern, and a third conductive pattern spaced apart from each other on the substrate;

a passivation layer on the first, second, and third conductive patterns and exposing each of the first, second, and third conductive patterns;

a via layer on the passivation layer and having a first via hole exposing one area of the first conductive pattern, a second via hole exposing one area of the second conductive pattern, and a third via hole exposing one area of the third conductive pattern;

a first alignment electrode and a second alignment electrode on the via layer and spaced apart from each other;

an insulating layer on the first and second alignment electrodes;

a light emitting element on the insulating layer between the first alignment electrode and the second alignment electrode; and a first electrode and a second electrode electrically connected to the light emitting element and spaced apart from each other, wherein the via layer has a first area having a first thickness and a second area having a second thickness thinner than the first thickness, wherein the second area of the via layer is directly adjacent to at least one of the first, second, and third via holes, and wherein the via layer is not in the pad area.

18. The display device of claim 17, wherein the second area of the via layer extends around at least one side of each of the first and second via holes.

19. The display device of claim 17, wherein the second area of the via layer extends entirely around each of the first, second, and third via holes.

20. The display device of claim 17, wherein the pad comprises:

a first pad electrode on the substrate;

the passivation layer on the first pad electrode and having a first pad electrode contact hole exposing a portion of the first pad electrode;

the insulating layer on the passivation layer and having a second pad electrode contact hole corresponding to the first pad electrode contact hole; and a second pad electrode on the insulating layer and electrically connected to the first pad electrode through the first and second pad electrode contact holes.

* * * * *